US012575141B2

(12) United States Patent
Yeh et al.

(10) Patent No.: US 12,575,141 B2
(45) Date of Patent: Mar. 10, 2026

(54) METAL-COMPRISING BOTTOM ISOLATION STRUCTURES

(71) Applicant: Taiwan Semiconductor Manufacturing Company, Ltd., Hsin-Chu (TW)

(72) Inventors: Wei-Ting Yeh, Hsinhu City (TW); Hung-Yu Yen, Taipei (TW); Yu-Yun Peng, Hsinchu (TW); Keng-Chu Lin, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 727 days.

(21) Appl. No.: 17/833,273

(22) Filed: Jun. 6, 2022

(65) Prior Publication Data

US 2023/0178593 A1     Jun. 8, 2023

Related U.S. Application Data

(60) Provisional application No. 63/286,287, filed on Dec. 6, 2021.

(51) Int. Cl.
    *H10D 62/10*          (2025.01)
    *H01L 21/02*          (2006.01)
    (Continued)

(52) U.S. Cl.
    CPC ....... *H10D 62/115* (2025.01); *H01L 21/0228* (2013.01); *H01L 21/02332* (2013.01);
    (Continued)

(58) Field of Classification Search
    CPC ......... H01L 21/76283; H01L 21/02271; H01L 21/02337; H01L 21/31612; H01L 21/31662; H01L 21/324; H01L 21/67115; H01L 21/76224; H01L 21/02532; H01L 21/30604; H01L 21/0228; H01L 21/762; H10D 30/014; H10D 30/43; H10D 30/62; H10D 30/6735; H10D 30/6757;
    (Continued)

(56) References Cited

U.S. PATENT DOCUMENTS

2006/0030165 A1*  2/2006  Ingle ................. H01L 21/76283
                                                    257/E21.546
2015/0162403 A1   6/2015  Oxland
                          (Continued)

*Primary Examiner* — Jessica S Manno
*Assistant Examiner* — Victor Joseph Lasasso
(74) *Attorney, Agent, or Firm* — Haynes and Boone, LLP

(57)          ABSTRACT

A semiconductor device structure and a formation method are provided. The method includes forming a sacrificial base layer over a substrate and forming a semiconductor stack over the sacrificial base layer. The semiconductor stack has multiple sacrificial layers and multiple semiconductor layers laid out alternately. The method also includes forming a gate stack to partially cover the sacrificial base layer, the semiconductor layers, and the sacrificial layers. The method further includes removing the sacrificial base layer to form a recess between the substrate and the semiconductor stack. In addition, the method includes forming a metal-containing dielectric structure to partially or completely fill the recess. The metal-containing dielectric structure has multiple sublayers.

20 Claims, 39 Drawing Sheets

(51) Int. Cl.

| | |
|---|---|
| *H01L 21/762* | (2006.01) |
| *H10D 30/01* | (2025.01) |
| *H10D 30/67* | (2025.01) |
| *H10D 64/01* | (2025.01) |

(52) U.S. Cl.

CPC .... *H01L 21/0234* (2013.01); *H01L 21/02356* (2013.01); *H01L 21/02362* (2013.01); *H01L 21/0259* (2013.01); *H01L 21/762* (2013.01); *H10D 30/031* (2025.01); *H10D 30/6735* (2025.01); *H10D 30/6757* (2025.01); *H10D 62/118* (2025.01); *H10D 64/017* (2025.01)

(58) Field of Classification Search

CPC .. H10D 62/118; H10D 62/364; H10D 62/121; H10D 62/371; H10D 64/017; H10D 64/021; H10D 64/256; H10D 30/024; H10D 84/038; H10D 62/115; C09K 11/7774; B82Y 10/00

See application file for complete search history.

(56) References Cited

U.S. PATENT DOCUMENTS

| | | | |
|---|---|---|---|
| 2016/0040857 A1* | 2/2016 | Inoue | F21V 7/30 |
| | | | 362/343 |
| 2021/0134795 A1 | 5/2021 | Ju et al. | |
| 2021/0320210 A1 | 10/2021 | Lin et al. | |
| 2023/0099214 A1* | 3/2023 | Miao | H10D 30/6757 |
| | | | 257/288 |

* cited by examiner

METAL-COMPRISING BOTTOM ISOLATION STRUCTURES

This is a non-provisional application of and claims benefit of U.S. Provisional Patent Application Ser. No. 63/286,287, filed on Dec. 6, 2021, the entire disclosure of which is incorporated herein by reference.

BACKGROUND

The semiconductor integrated circuit (IC) industry has experienced rapid growth. Technological advances in IC materials and design have produced generations of ICs. Each generation has smaller and more complex circuits than the previous generation.

Over the course of IC evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and lowering associated costs.

However, these advances have increased the complexity of processing and manufacturing ICs. Since feature sizes continue to decrease, fabrication processes continue to become more difficult to perform. Therefore, it is a challenge to form reliable semiconductor devices at smaller and smaller sizes.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1A:
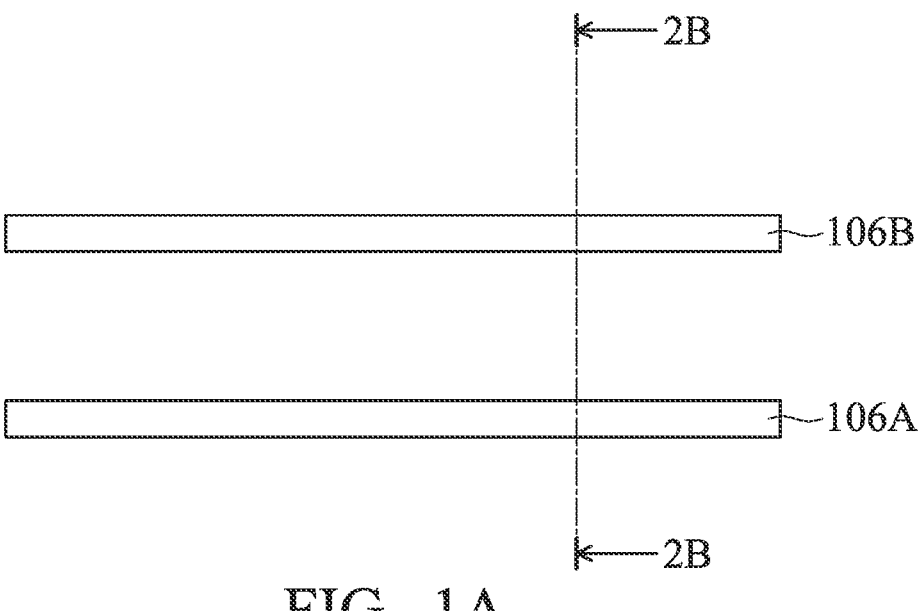
FIG. 1A and FIG. 1B are top views of various stages of a process for forming a portion of a semiconductor device structure, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The term "substantially" in the description, such as in "substantially flat" or in "substantially coplanar", etc., will be understood by the person skilled in the art. In some embodiments the adjective substantially may be removed. Where applicable, the term "substantially" may also include embodiments with "entirely", "completely", "all", etc. Where applicable, the term "substantially" may also relate to 90% or higher, such as 95% or higher, especially 99% or higher, including 100% of what is specified. Furthermore, terms such as "substantially parallel" or "substantially perpendicular" are to be interpreted as not to exclude insignificant deviation from the specified arrangement and may include for example deviations of up to 10 degrees in some embodiments. The word "substantially" does not exclude "completely" e.g. a composition which is "substantially free" from Y may be completely free from Y in some embodiments.

Terms such as "about" in conjunction with a specific distance or size are to be interpreted so as not to exclude insignificant deviation from the specified distance or size and may include for example deviations of up to 10% of what is specified in some embodiments. The term "about" in relation to a numerical value x may mean x±5 or 10% of what is specified in some embodiments.

Embodiments of the disclosure may relate to FinFET structure having fins and/or gate all around (GAA) transistor structures (which include channel layers suspended over a substrate, where the channel layers are fabricated from semiconductor layers stacks (i.e., fins)). The fins may be patterned using any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in some embodiments, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins. However, the fins may be formed using one or more other applicable processes.

Some embodiments of the disclosure are described. Additional operations can be provided before, during, and/or after the stages described in these embodiments. Some of the stages that are described can be replaced or eliminated for different embodiments. Additional features can be added to the semiconductor device structure. Some of the features described below can be replaced or eliminated for different embodiments. Although some embodiments are discussed with operations performed in a particular order, these operations may be performed in another logical order.

Figure 2A:
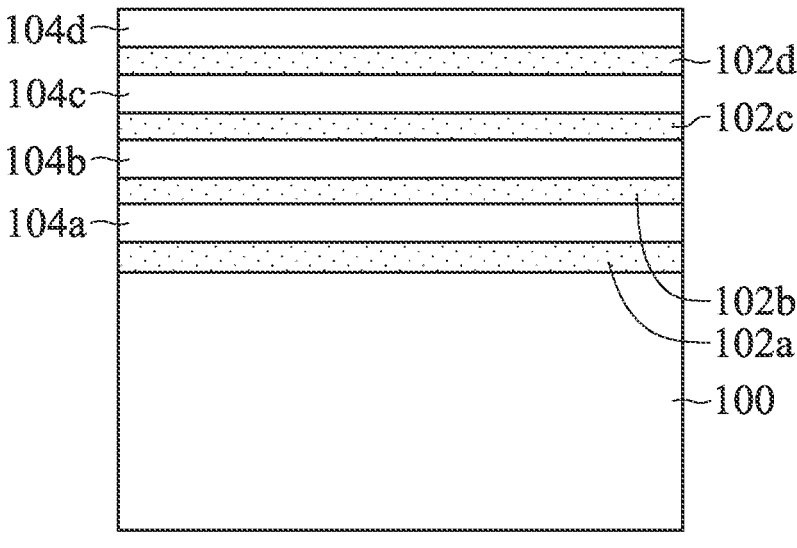
FIGS. 2A-2L are cross-sectional views of various stages of a process for forming a portion of a semiconductor device structure, in accordance with some embodiments.

FIGS. 2A-2L are cross-sectional views of various stages of a process for forming a portion of a semiconductor device structure, in accordance with some embodiments. As shown in FIG. 2A, a semiconductor substrate 100 is received or provided. In some embodiments, the semiconductor substrate 100 is a bulk semiconductor substrate, such as a semiconductor wafer. The semiconductor substrate 100 may include silicon or other elementary semiconductor materials, such as germanium. The semiconductor substrate 100 may be un-doped or doped (e.g., p-type, n-type, or a combination thereof). In some embodiments, the semiconductor substrate 100 includes an epitaxially grown semiconductor layer on a dielectric layer. The epitaxially grown semiconductor layer may be made of silicon, germanium, silicon, germanium, one or more other suitable materials, or a combination thereof.

In some embodiments, the semiconductor substrate 100 includes a compound semiconductor. For example, the compound semiconductor includes one or more III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions. Each of them is greater than or equal to zero, and a sum of X1, X2, X3, Y1, Y2, Y3, and Y4 is equal 1. The compound semiconductor may include silicon carbide, gallium arsenide, indium arsenide, indium phosphide, one or more other suitable compound semiconductors, or a combination thereof. Other suitable substrate materials, such as II-VI compound semiconductors, may also be used.

In some embodiments, the semiconductor substrate 100 is an active layer of a semiconductor-on-insulator (SOI) substrate. The SOI substrate may be fabricated using a separation by implantation of oxygen (SIMOX) process, a wafer bonding process, another applicable method, or a combination thereof. In some other embodiments, the semiconductor substrate 100 includes a multi-layered structure, such as a silicon germanium layer over a bulk silicon layer.

As shown in FIG. 2A, a semiconductor stack having multiple semiconductor layers is formed over the semiconductor substrate 100, in accordance with some embodiments. In some embodiments, the semiconductor stack includes multiple semiconductor layers 102a, 102b, 102c, and 102d, and the semiconductor stack also includes multiple semiconductor layers 104a, 104b, 104c, and 104d. In some embodiments, the semiconductor layers 102a-102d and the semiconductor layers 104a-104d are laid out alternately, as shown in FIG. 2A.

In some embodiments, the semiconductor layer 102a is used as a sacrificial base layer and will be replaced with an isolation structure in a subsequent process. In some embodiments, the semiconductor layers 102b-102d function as sacrificial layers that will be removed in a subsequent process to release the semiconductor layers 104a-104d. The semiconductor layers 104a-104d that are released may function as channel structures (layers) of one or more transistors.

In some embodiments, the semiconductor layers 104a-104d that will be used to form channel structures are made of a material that is different than that of the semiconductor layers 102a-102d. In some embodiments, the semiconductor layers 104a-104d are made of or include silicon or silicon germanium. In some embodiments, the semiconductor layers 102a-102d are made of or include silicon germanium with different atomic concentrations of germanium than that of the semiconductor layers 104a-104d, so as to achieve different etching selectivity and/or different oxidation rates during subsequent processing. In some embodiments, the semiconductor layers 102a-102d have a greater atomic concentration of germanium than that of the semiconductor layers 104a-104d. In some embodiments, the semiconductor layers 104a-104d are substantially free of germanium.

In some embodiments, the semiconductor layer 102a has a different atomic concentration of germanium than that of the semiconductor layers 102b, 102c, 102d, or a combination thereof. In some embodiments, the semiconductor layer 102a has a greater atomic concentration of germanium than that of the semiconductor layers 102b, 102c, 102d, or a combination thereof. The greater atomic concentration of germanium of the semiconductor layer 102a enables the semiconductor layer 102a to have different etching selectivity to the semiconductor layers 102b, 102c, and 102d. In some embodiments, an etching rate of the semiconductor layer 102a to a given etchant is higher than an etching rate of the semiconductor layers 102b, 102c, and 102d.

The present disclosure contemplates that the semiconductor layers 102a-102d and the semiconductor layers 104a-104d include any combination of materials (such as semiconductor materials) that can provide desired etching selectivity, desired oxidation rate differences, and/or desired performance characteristics (e.g., materials that maximize current flow).

In some embodiments, the semiconductor layers 102a-102d and 104a-104d are formed using multiple epitaxial growth operations. Each of the semiconductor layers 102a-102d and semiconductor layers 104a-104d may be formed using a selective epitaxial growth (SEG) process, a CVD process (e.g., a vapor-phase epitaxy (VPE) process, a low-pressure chemical vapor deposition (LPCVD) process, and/or or an ultra-high vacuum CVD (UHV-CVD) process), a molecular beam epitaxy process, one or more other applicable processes, or a combination thereof. In some embodiments, the semiconductor layers 102a-102d and semiconductor layers 104a-104d are grown in-situ in the same process chamber. In some embodiments, the growth of the semiconductor layers 102a-102d and semiconductor layers 104a-104d are alternately and sequentially performed in the same process chamber to complete the formation of the semiconductor stack. In some embodiments, the vacuum of the process chamber is not broken before the epitaxial growth of the semiconductor stack is accomplished.

Figure 2B:
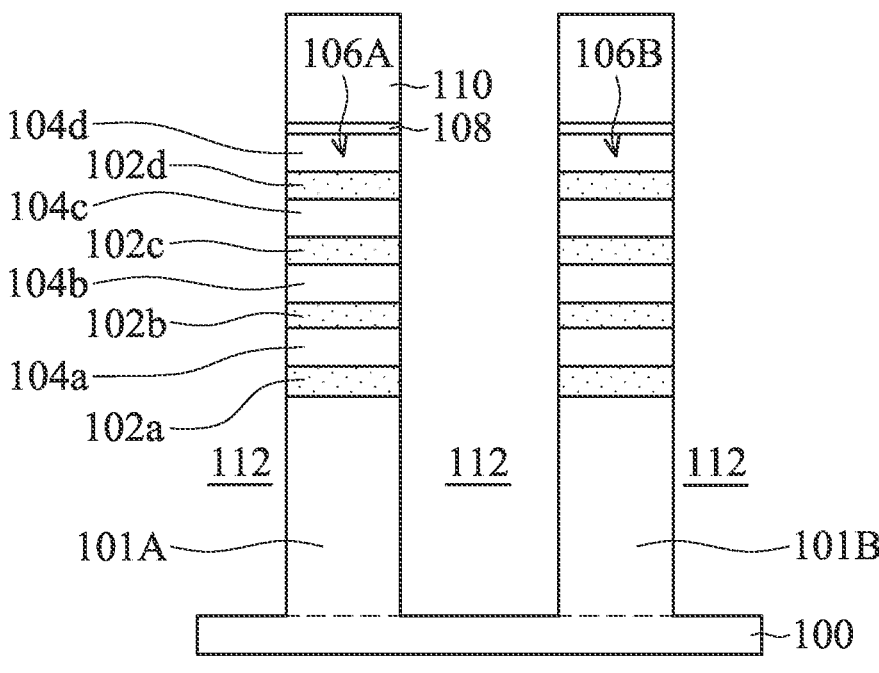

Afterwards, hard mask elements are formed over the semiconductor stack to assist in a subsequent patterning of the semiconductor stack. One or more photolithography processes and one or more etching processes are used to pattern the semiconductor stack into fin structures 106A and 106B, as shown in FIG. 2B in accordance with some embodiments. The fin structures 106A and 106B may be patterned by any suitable method. For example, the fin structures 106A and 106B may be patterned using one or more photolithography processes, including double-patterning or multi-patterning processes. Double-patterning or multi-patterning processes may combine photolithography and self-aligned processes, allowing patterns to be created that have, for example, pitches smaller than what is otherwise obtainable using a single, direct photolithography process.

The semiconductor stack is partially removed to form trenches 112, as shown in FIG. 2B. Each of the fin structures 106A and 106B may include respective portions of the semiconductor layers 102a-102d, semiconductor layers 104a-104d, and semiconductor fins 101A and 101B. The semiconductor substrate 100 may also be partially removed during the etching process that forms the fin structures 106A and 106B. Protruding portions of the semiconductor substrate 100 that remain form the semiconductor fins 101A and 101B, as shown in FIG. 2B.

Each of the hard mask elements may include a first mask layer 108 and a second mask layer 110. The first mask layer 108 and the second mask layer 110 may be made of different materials. In some embodiments, the first mask layer 108 is made of a material that has good adhesion to the semiconductor layer 104d. The first mask layer 108 may be made of silicon oxide, germanium oxide, silicon germanium oxide, one or more other suitable materials, or a combination thereof. In some embodiments, the second mask layer 110 is made of a material that has good etching selectivity to the semiconductor layers 102a-102d and semiconductor layers 104a-104d. The second layer 110 may be made of silicon nitride, silicon oxynitride, silicon carbide, one or more other suitable materials, or a combination thereof.

Figure 1B:
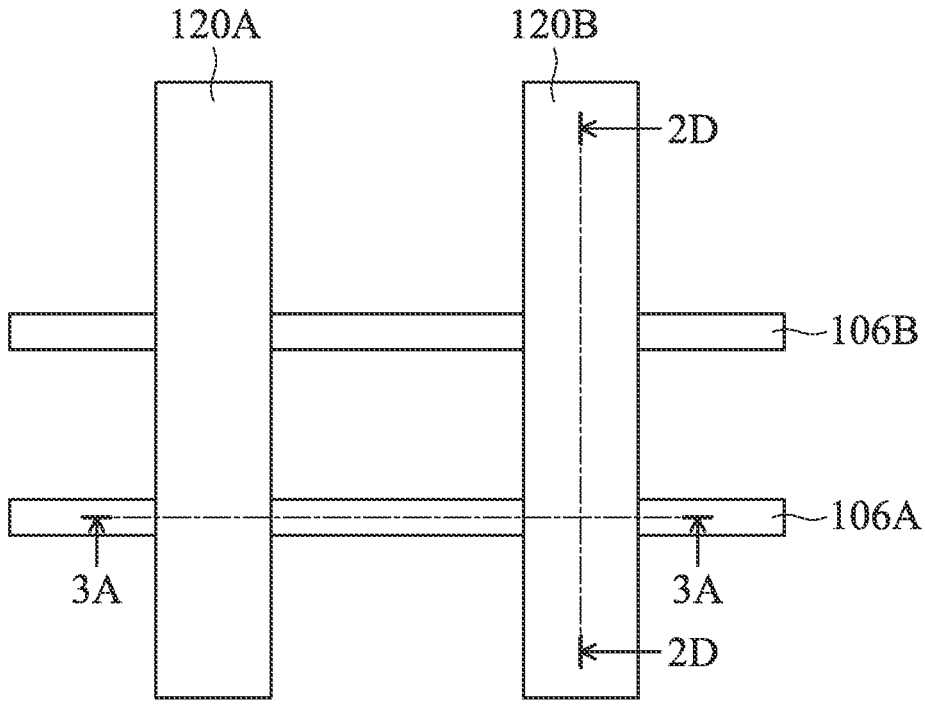

FIGS. 1A-1B are top views of various stages of a process for forming a portion of a semiconductor device structure, in accordance with some embodiments. In some embodiments, the fin structures 106A and 106B are oriented lengthwise. In some embodiments, the extending directions of the fin structures 106A and 106B are substantially parallel to each other, as shown in FIG. 1A. In some embodiments, FIG. 2B is a cross-sectional view of the structure taken along the line 2B-2B in FIG. 1A.

Figure 2C:
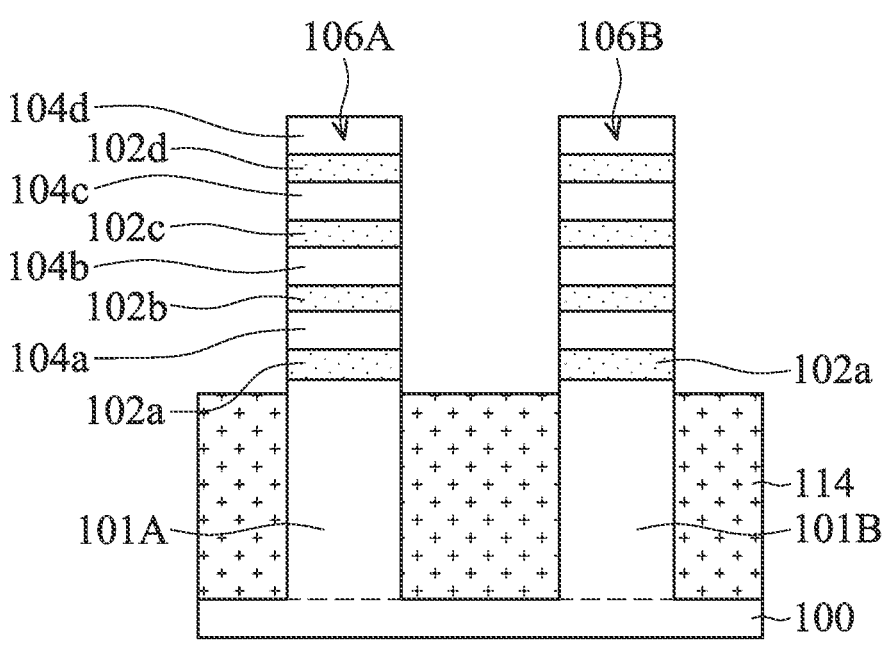

As shown in FIG. 2C, an isolation structure 114 is formed to surround lower portions of the fin structures 106A and 106B, in accordance with some embodiments. In some embodiments, one or more dielectric layers are deposited over the fin structures 106A and 106B and the semiconductor substrate 100 to overfill the trenches 112. The dielectric layers may be made of silicon oxide, silicon oxynitride, borosilicate glass (BSG), phosphoric silicate glass (PSG), borophosphosilicate glass (BPSG), fluorinated silicate glass (FSG), low-k material, porous dielectric material, one or more other suitable materials, or a combination thereof. The dielectric layers may be deposited using a flowable chemical vapor deposition (FCVD) process, an atomic layer deposition (ALD) process, a chemical vapor deposition (CVD) process, one or more other applicable processes, or a combination thereof.

Afterwards, a planarization process is used to partially remove the dielectric layers. The hard mask elements (including the first mask layer 108 and the second mask layer 110) may also function as a stop layer of the planarization process. The planarization process may include a chemical mechanical polishing (CMP) process, a grinding process, a dry polishing process, an etching process, one or more other applicable processes, or a combination thereof. Afterwards, one or more etching back processes are used to partially remove the dielectric layers. As a result, the remaining portion of the dielectric layers forms the isolation structure 114. Upper portions of the fin structures 106A and 106B protrude from the top surface of the isolation structure 114, as shown in FIG. 2C.

Afterwards, the hard mask elements (including the first mask layer 108 and the second mask layer 110) are removed. Alternatively, in some other embodiments, the hard mask elements are removed or consumed during the planarization process and/or the etching back process that forms the isolation structure 114.

Figure 2D:
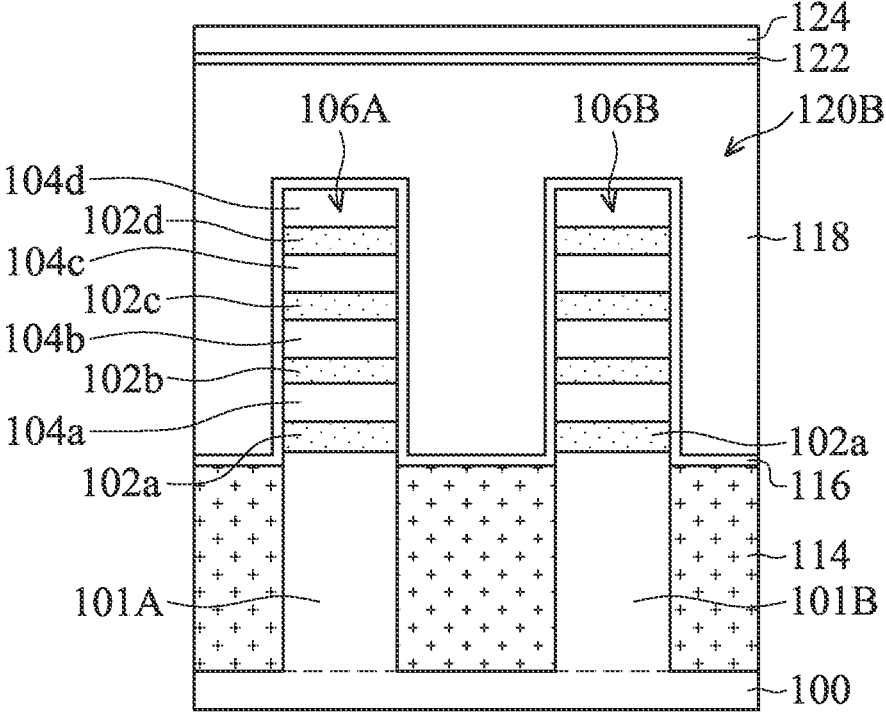
Figure 3A:
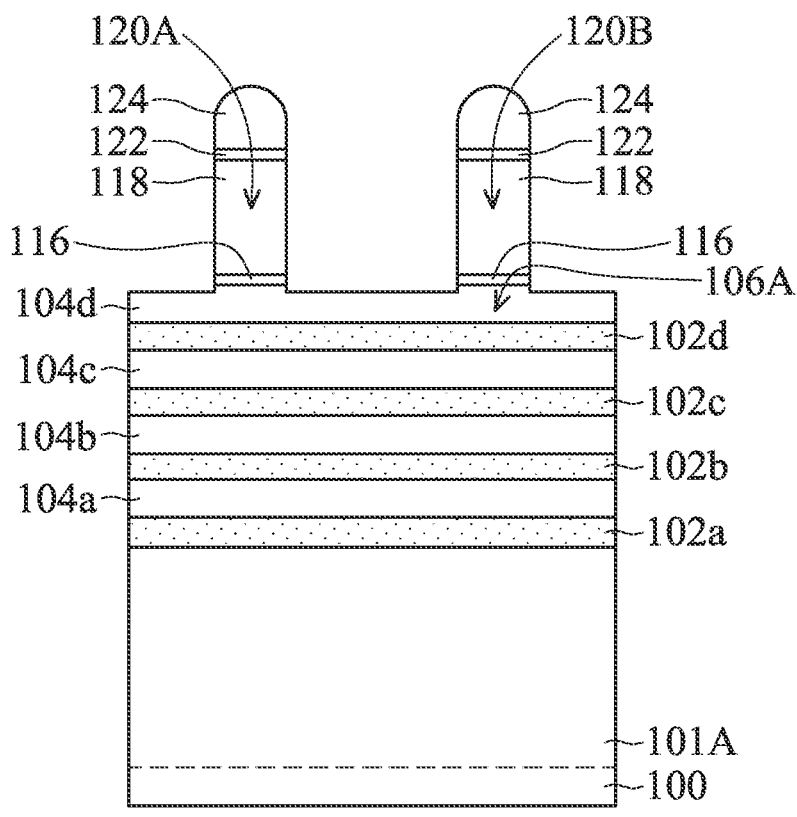
FIGS. 3A-3P are cross-sectional views of various stages of a process for forming a portion of a semiconductor device structure, in accordance with some embodiments.

Afterwards, dummy gate stacks 120A and 120B are formed to extend across the fin structures 106A and 106B, as shown in FIG. 1B in accordance with some embodiments. In some embodiments, FIG. 2D is a cross-sectional view of the structure taken along the line 2D-2D in FIG. 1B. FIGS. 3A-3P are cross-sectional views of various stages of a process for forming a portion of a semiconductor device structure, in accordance with some embodiments. In some embodiments, FIG. 3A is a cross-sectional view of the structure taken along the line 3A-3A in FIG. 1B.

As shown in FIGS. 1B, 2D, and 3A, the dummy gate stacks 120A and 120B are formed to partially cover and to extend across the fin structures 106A and 106B, in accordance with some embodiments. In some embodiments, the dummy gate stacks 120A and 120B wrap around the fin structures 106A and 106B. As shown in FIG. 2D, the dummy gate stack 120B extends across and wraps around the fin structures 106A and 106B.

As shown in FIGS. 2D and 3A, each of the dummy gate stacks 120A and 120B includes a dummy gate dielectric layer 116 and a dummy gate electrode 118. The dummy gate dielectric layers 116 may be made of or include silicon oxide. The dummy gate electrodes 118 may be made of or include polysilicon. In some embodiments, a dummy gate dielectric material layer and a dummy gate electrode layer are sequentially deposited over the isolation structure 114 and the fin structures 106A and 106B. The dummy gate dielectric material layer may be deposited using an ALD process, a CVD process, one or more other applicable processes, or a combination thereof. The dummy gate electrode layer may be deposited using a CVD process. Afterwards, the dummy gate dielectric material layer and the dummy gate electrode layer are patterned to form the dummy gate stacks 120A and 120B.

In some embodiments, hard mask elements including mask layers 122 and 124 are used to assist in the patterning process for forming the dummy gate stacks 120A and 120B. With the hard mask elements as an etching mask, one or more etching processes are used to partially remove the dummy gate dielectric material layer and the dummy gate electrode layer. As a result, remaining portions of the dummy gate dielectric material layer and the dummy gate electrode layer form the dummy gate dielectric layers 116 and the dummy gate electrodes 118 of the dummy gate stacks 120A and 120B, respectively.

Figures 2E, 2F:
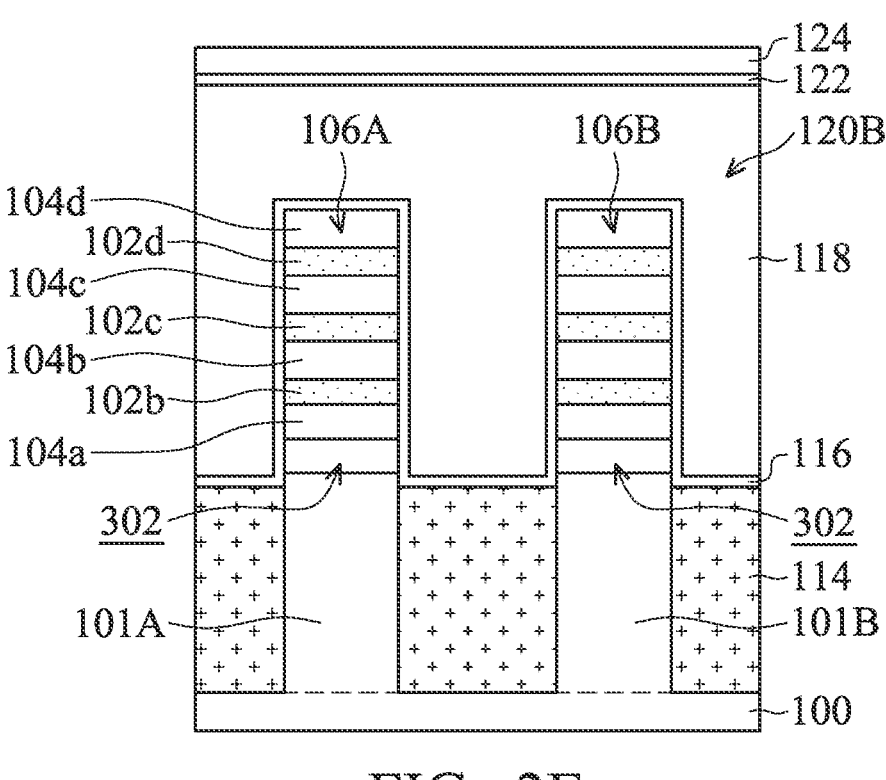
Figure 3B:
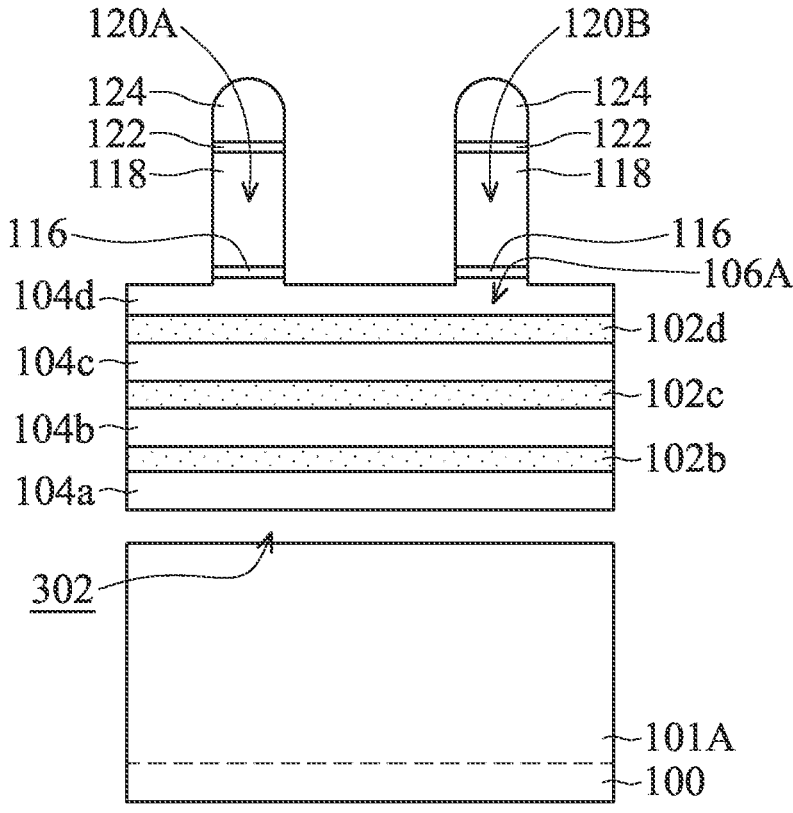

As shown in FIGS. 2E and 3B, the semiconductor layer 102a that functions as a sacrificial base layer is removed, in accordance with some embodiments. As a result, a first recess 302 is formed between the substrate 100 and the fin structure 106A, and a second recess 302 is formed between the substrate 100 (e.g., semiconductor fins 101A and 101B) and the fin structures 106A and 106B, as shown in FIGS. 2E and 3B. As mentioned above, in some embodiments, the greater atomic concentration of germanium of the semiconductor layer 102a enables the semiconductor layer 102a to be etched at a higher etching rate than the semiconductor layers 102b-102d. Therefore, while the semiconductor layer 102a is removed, the semiconductor layers 102b-102d are substantially not (or merely slightly) etched. Further, because the semiconductor layers 104a-104d include a different material and/or different composition (e.g., different germanium concentration) than semiconductor layer 102a, semiconductor layers 104a-104d also are substantially not (or merely slightly) etched during removal of semiconductor layer 102a from fin structures 106A and 106B.

Figure 3C:
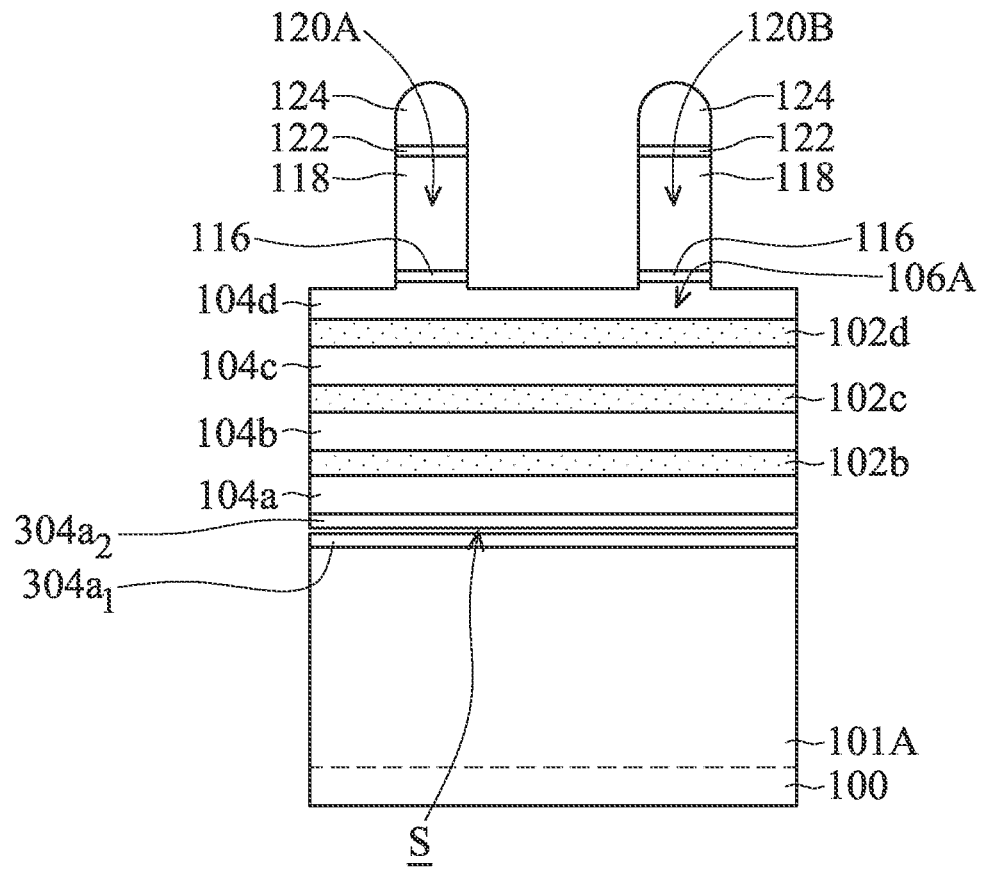

As shown in FIGS. 2F and 3C, first dielectric layers $304a_1$ and second dielectric layers $304a_2$ are respectively formed over the bottoms and tops of the recesses 302, which are provided by top surfaces of semiconductor fins 101A and 101B and bottom surfaces of semiconductor layers 104a, respectively, in accordance with some embodiments. As shown in FIG. 3C, the first dielectric layers $304a_1$ extend along the top surfaces of semiconductor fins 101A and 101B (i.e., bottoms of the recesses 302) and partially fill recesses 302, and the second dielectric layers $304a_2$ extend along the bottom surfaces of semiconductor layers 104A (i.e., tops of the recesses 302) and partially fill recesses 302.

In some embodiments, the first dielectric layers $304a_1$ and second dielectric layers $304a_2$ are made of an insulating material that has a high thermal conductivity. For example, the first dielectric layers $304a_1$ and second dielectric layers $304a_2$ have higher thermal conductivity than that of silicon nitride, silicon oxide, carbon-containing silicon nitride (SiCN), or carbon-containing silicon oxynitride (SiOCN).

In some embodiments, the first dielectric layers $304a_1$ and second dielectric layers $304a_2$ are made of or include a metal-containing dielectric material. The first dielectric layers $304a_1$ and second dielectric layers $304a_2$ may be made of an aluminum-containing dielectric material (such as aluminum oxide), a beryllium-containing dielectric material (such as beryllium oxide), a magnesium-containing dielectric material (such as magnesium oxide), one or more other suitable dielectric materials, or a combination thereof. In some embodiments, the first dielectric layers $304a_1$ and the second dielectric layers $304a_2$ include a metal-containing dielectric material having an amorphous structure (i.e., a dielectric material in non-crystalline form (i.e., having a disordered atomic structure)). For example, the first dielectric layers $304a_1$ and the second dielectric layers $304a_2$ may be made of aluminum oxide having an amorphous structure, which may be referred to as amorphous aluminum oxide (a-AlO).

In some embodiments, the first dielectric layers $304a_1$ and second dielectric layers $304a_2$ substantially fill the recesses 302, as shown in FIGS. 2F and 3C. In some embodiments, to ensure that the recesses 302 are substantially filled, the first dielectric layers $304a_1$ and second dielectric layers $304a_2$ are simultaneously deposited using an atomic layer deposition (ALD) process. In some embodiments, an etching operation is then used to remove the portions of the first dielectric layers $304a_1$ and second dielectric layers $304a_2$ that are formed outside of the recesses 302.

Figure 2G:
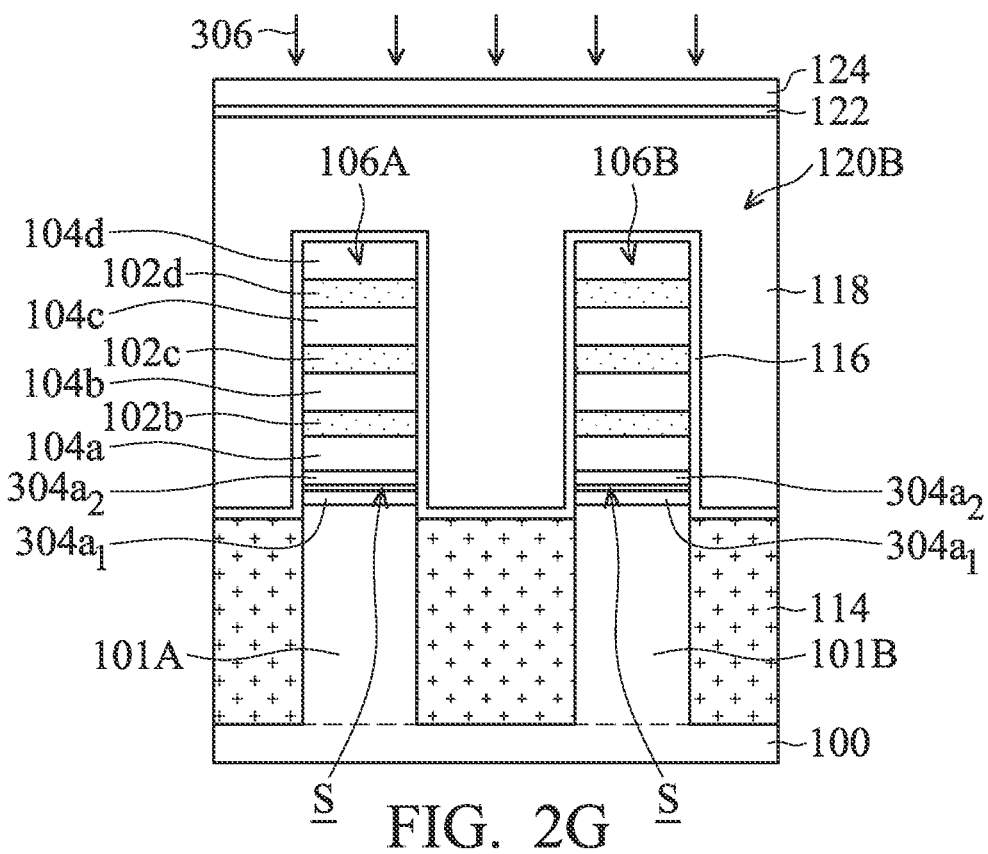
Figure 3D:
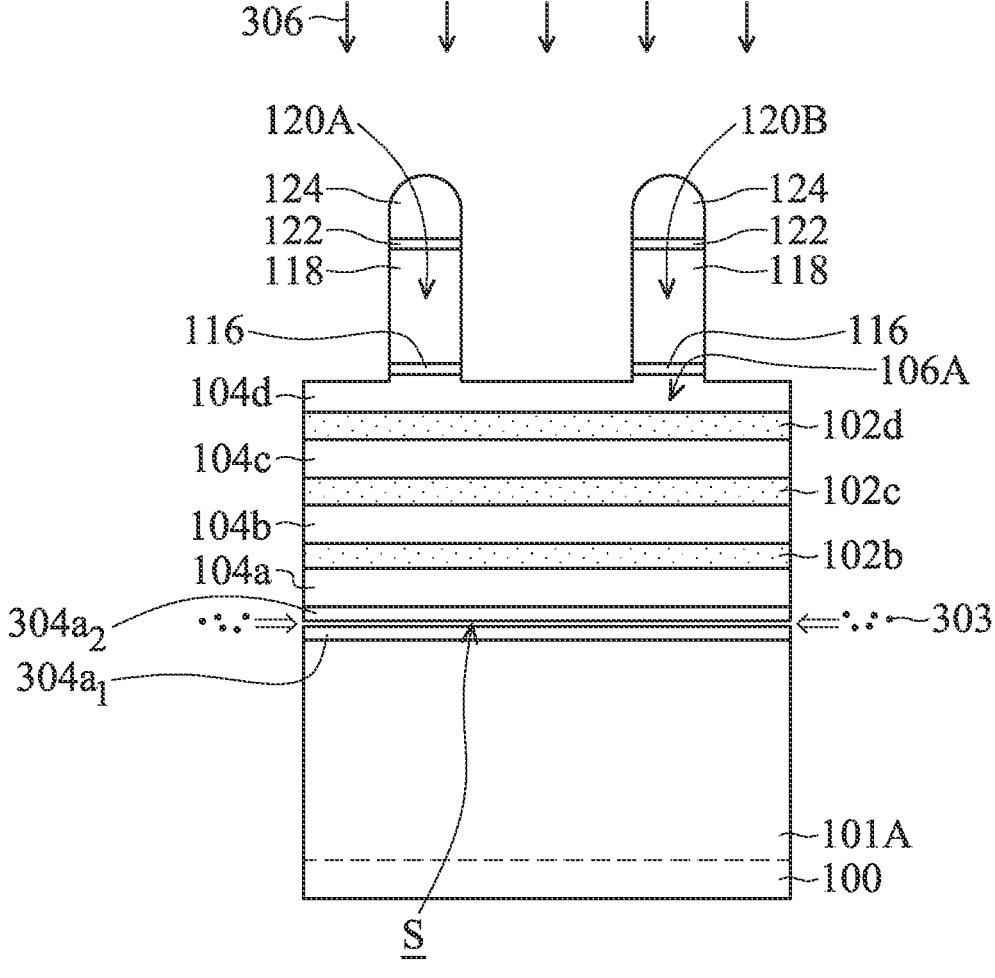

In some embodiments, due to the characteristics of the ALD process, a seam S is naturally formed between the first dielectric layers 304 $a_1$ and the second dielectric layers $304a_2$, as shown in FIGS. 2F and 3C. Even if the operation time of the ALD process is elongated, no more dielectric material can be deposited in the recesses 302 to fill the seam S. The seam S may negatively affect the heat dissipation of the semiconductor device structure through the first dielectric layers $304a_1$ and the second dielectric layers $304a_2$. Accordingly, afterward depositing the first dielectric layers $304a_1$ and the second dielectric layers $304a_2$, a seam elimination operation is performed to eliminate or at least narrow the seam S. As shown in FIGS. 2G and 3D, a seam elimination operation 306 is performed to introduce particles 303 into the seam S, in accordance with some embodiments. The particles 303 may help to eliminate or to narrow the seam S. In some embodiments, the particles 303 are nitrogen-containing particles. In some embodiments, the nitrogen-containing particles include nitrogen plasma. In some embodiments, the seam elimination operation 306 is a nitridation process. The seam elimination operation 306 may include a decoupled plasma nitridation process, a remote nitridation process that can generate nitrogen-containing radicals, one or more other applicable processes, or a combination thereof.

Figure 2H:
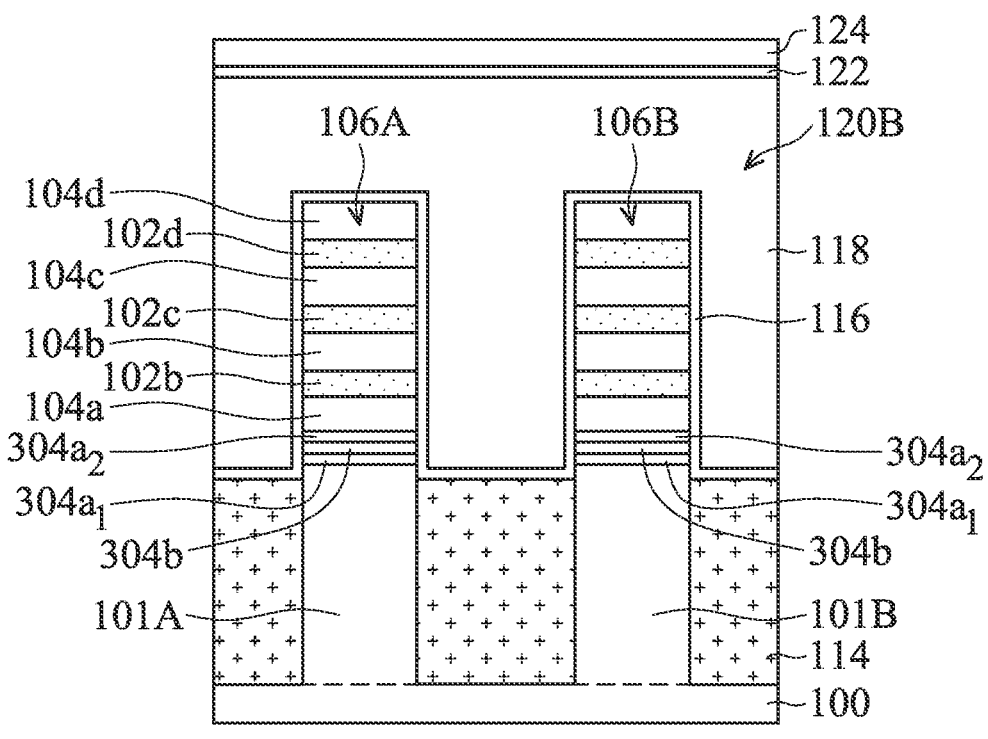
Figure 3E:
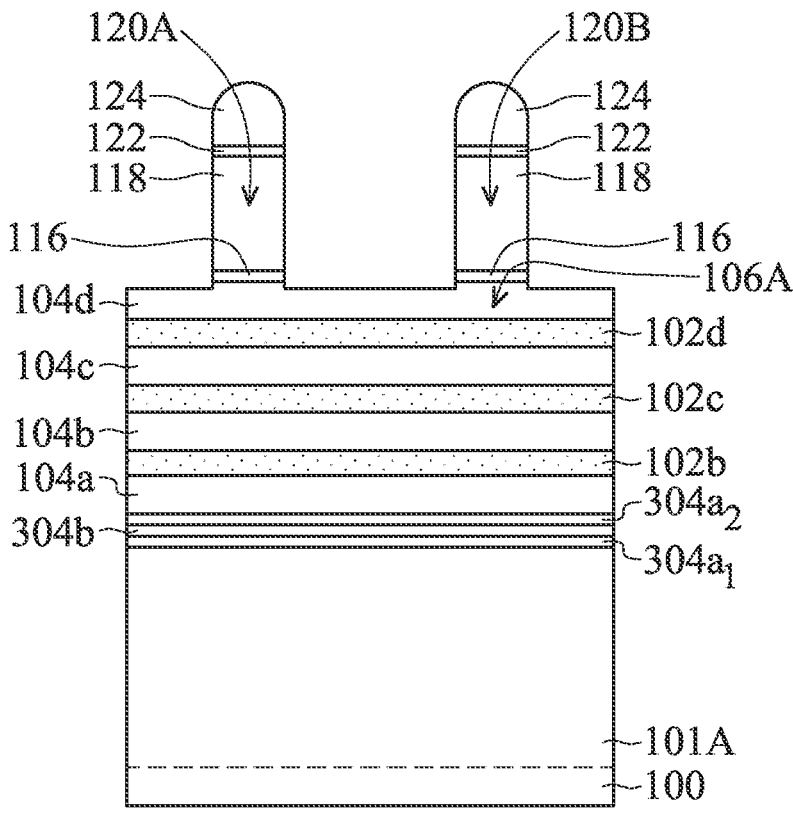

As shown in FIGS. 2H and 3E, due to the introducing of the particles 303, intermediate dielectric layers 304b are formed, in accordance with some embodiments. In some embodiments, the particles 303 are introduced into portions of the first dielectric layers $304a_1$ and the second dielectric layers $304a_2$ along the seams S. Due to the inclusion of the particles 303, the portions of the first dielectric layers $304a_1$ and the second dielectric layers $304a_2$ that include the particles (e.g., nitrogen) expand and are turned into the intermediate dielectric layers 304b. In some embodiments, the intermediate dielectric layers 304b substantially occupy the space where the seams S are originally positioned. In some embodiments, the entirety of the seams S is substantially occupied by the intermediate dielectric layers 304b. As a result, the seams S are substantially eliminated. Since the seams S are substantially eliminated, the heat dissipation of the semiconductor device structure through the first dielectric layers $304a_1$, the intermediate dielectric layers 304b, and the second dielectric layers $304a_2$ is significantly improved.

In some embodiments, the first dielectric layers $304a_1$ and the second dielectric layers $304a_2$ are aluminum-containing oxide layers. In some embodiments, the first dielectric layers $304a_1$ and the second dielectric layers $304a_2$ are made of aluminum oxide, and the particles 303 are nitrogen-containing plasma. In some embodiments, the intermediate dielectric layers 304b are made of or include a nitrogen-containing dielectric material, such as aluminum nitride (AlN) or aluminum oxynitride (AlON). In some embodiments, the intermediate dielectric layers 304b include a metal-and-nitrogen containing dielectric material having an amorphous structure (i.e., a dielectric material in non-crystalline form (i.e., having a disordered atomic structure)). For example, the intermediate dielectric layers 304b may be made of aluminum nitride or aluminum oxynitride having an amorphous structure, which may be referred to as amorphous aluminum nitride (a-AlN) and aluminum oxynitride (a-AlON), respectively.

In some embodiments, each of the intermediate dielectric layers 304b is formed between the remaining portions of the first dielectric layers $304a_1$ and the second dielectric layers $304a_2$. In some embodiments, the remaining portions of the first dielectric layers $304a_1$ and the second dielectric layers $304a_2$ remain substantially free of nitrogen. In some embodiments, an inner portion of the intermediate dielectric layer 304b has a higher atomic concentration of nitrogen than that of an outer portion of the intermediate dielectric layer 304b (such as those portions proximate to and interfacing with the first dielectric layers $304a_1$ and the second dielectric layers $304a_2$). The atomic concentration of nitrogen in the intermediate dielectric layers 304b may gradually decrease along a direction from the center of the intermediate dielectric layers 304b towards the first dielectric layers $304a_1$ or the second dielectric layers $304a_2$.

Figure 2I:
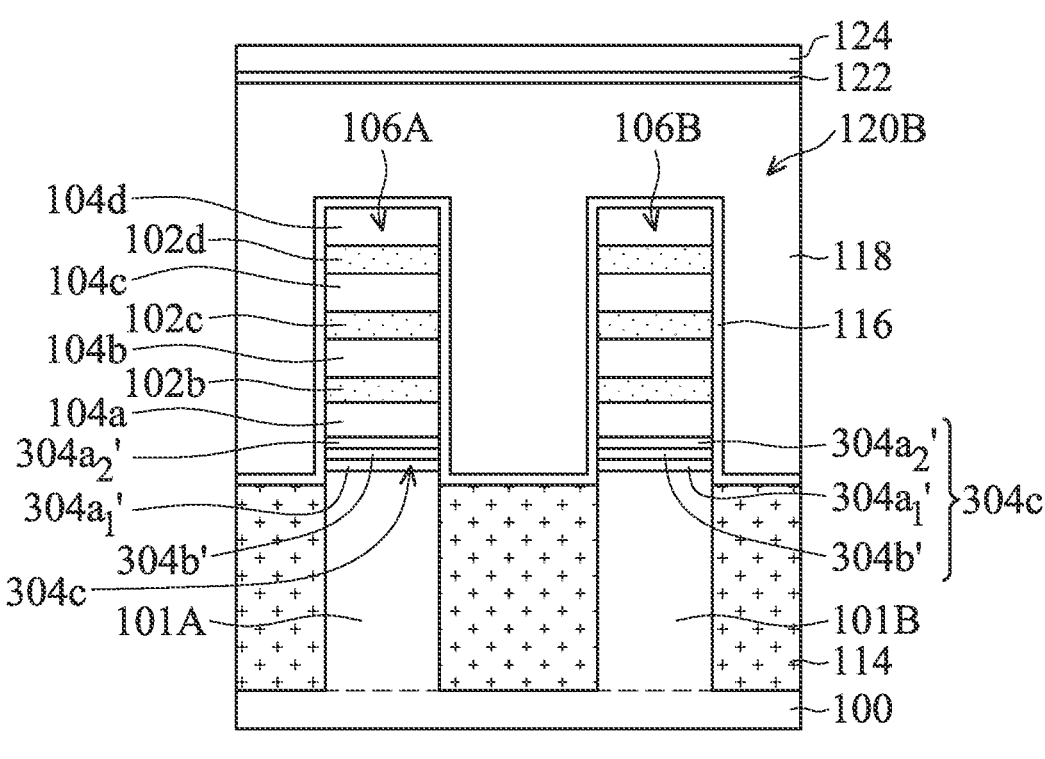
Figure 3F:
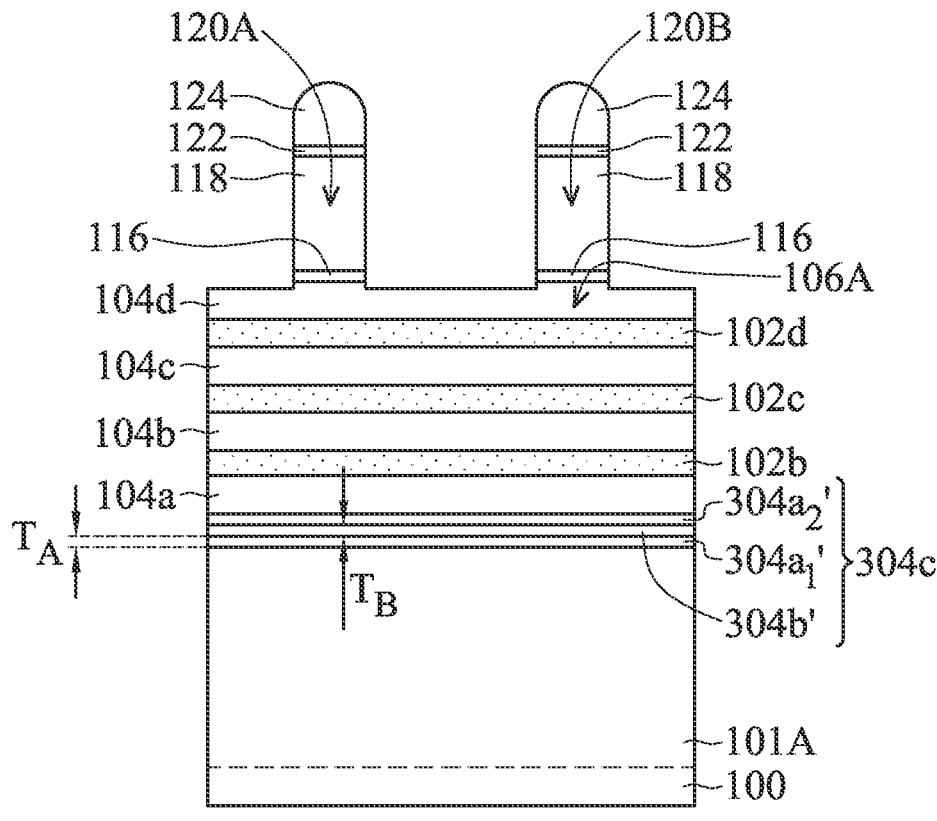

As shown in FIGS. 2I and 3F, the first dielectric layers $304a_1$, the second dielectric layers $304a_2$, and the intermediate dielectric layers $304b$ are crystallized, in accordance with some embodiments. In some embodiments, an annealing process is performed on the first dielectric layers $304a_1$, the second dielectric layers $304a_2$, and the intermediate dielectric layers $304b$ to convert (crystallize) the amorphous dielectric materials (i.e., dielectric materials having non-crystalline structures) into crystalline dielectric materials (i.e., dielectric materials having crystalline structures). The reference numbers $304a_1'$, $304a_2'$, and $304b'$ are used to designate the first dielectric layers, the second dielectric layers, and the intermediate dielectric layers after they are crystallized, as shown in FIGS. 2I and 3F. The first dielectric layers $304a_1'$, the second dielectric layers $304a_2'$, and the intermediate dielectric layers $304b'$ together form isolation structures $304c$, as shown in FIGS. 2I and 3F. In some embodiments, the intermediate dielectric layers $304b'$ has a higher thermal conductivity than that of the first dielectric layers $304a_1'$ and/or the second dielectric layers $304a_2'$. In some embodiments, the first dielectric layers $304a_1'$ and/or the second dielectric layers $304a_2'$ has a greater etching resistance than that of the intermediate dielectric layers $304b'$. In some embodiments, the first dielectric layers $304a_1'$ and the second dielectric layers $304a_2'$ may be made of aluminum oxide having a crystalline structure, which may be referred to as crystalline aluminum oxide (c-AlO), and the intermediate dielectric layers $304b'$ may be made of aluminum nitride or aluminum oxynitride having a crystalline structure, which may be referred to as crystalline aluminum nitride (c-AlN) and crystalline aluminum oxynitride (c-AlON), respectively.

In some embodiments, the first dielectric layers $304a_1'$ and the second dielectric layer $304a_2'$ have substantially the same thickness, as shown in FIG. 3F. In some embodiments, the first dielectric layers $304a_1'$ are substantially as thick as the first dielectric layers $304a_1$ shown in FIG. 3E. In some embodiments, the second dielectric layers $304a_2'$ are substantially as thick as the second dielectric layers $304a_2$ shown in FIG. 3E. In some embodiments, the intermediate dielectric layers $304b'$ are substantially as thick as the intermediate dielectric layers $304b$ shown in FIG. 3E.

Many variations and/or modifications can be made to embodiments of the disclosure. In some embodiments, the crystallization of the first dielectric layers $304a_1$ and the second dielectric layers $304a_2$ would cause shrinkage of these layers. In these cases, each of the first dielectric layers $304a_1'$ is thinner than each of the first dielectric layers $304a_1$ shown in FIG. 3E, and each of the second dielectric layers $304a_2'$ is thinner than each of the second dielectric layers $304a_2$ shown in FIG. 3E. For example, each of the first dielectric layers $304a_1$ and the second dielectric layers $304a_2$ may have a thickness that is in a range from about 9 nm to about 9.5 nm. Each of the first dielectric layers $304a_1'$ and the second dielectric layer $304a_2'$ may have a thickness that is in a range from about 8 nm to about 8.5 nm. The shrinkage ratio caused by the crystallization may be in a range from about 10% to about 15%.

As shown in FIG. 3F, the first dielectric layers $304a_1'$ have a thickness of $T_A$, and the intermediate dielectric layers $304b'$ have a thickness of $T_B$. In some embodiments, the ratio of $T_A/(2T_A+T_B)$ is in a range from about 0.3 to about 0.4. In some cases, if the ratio $T_A/(2T_A+T_B)$ is smaller than about 0.3, the first dielectric layers $304a_1'$ and/or the second dielectric layers $304a_2'$ may be too thin to sustain subsequent processes that involve etching. It may also be difficult for the first dielectric layers $304a_1'$, the second dielectric layers $304a_2'$, and the intermediate dielectric layer $304b'$ to completely fill the recesses 302. In some embodiments, one or more etching processes are used to remove the excess portions of the first dielectric layers $304a_1'$, the intermediate dielectric layers $304b'$, and the second dielectric layers $304a_2'$ outside of the recesses 302. If the first dielectric layers $304a_1'$, the intermediate dielectric layers $304b'$, and the second dielectric layers $304a_2'$ do not completely fill the recesses 302, the etchant may thus enter the recesses 302. As a result, the first dielectric layers $304a_1'$, the intermediate dielectric layers $304b'$, and the second dielectric layers $304a_2'$ inside the recesses 302 may be partially or completely removed.

In some other cases, if the ratio $T_A/(2T_A+T_B)$ is greater than about 0.4, the first dielectric layers $304a_1'$ and the second dielectric layers $304a_2'$ may be too thick and occupy too much space of the recesses 302. As a result, the intermediate dielectric layers $304b_1'$ may be too thin and the overall thermal conductivity of the isolation structures $304c$ may not be sufficient (e.g., too small).

In some embodiments, a thermal annealing process is used to accomplish the crystallization of the first dielectric layers $304a_1'$, the second dielectric layers $304a_2'$, and the intermediate dielectric layers $304b'$. The thermal annealing process may be performed in a furnace. The thermal annealing process may be a rapid thermal anneal (RTA) process. The operation temperature of the thermal annealing process may be in a range from about 600 degrees C. to about 700 degrees C. The operation time of the thermal annealing process may be in a range from about 2 hours to about 3 hours. The thermal annealing process may be performed in a nitrogen ($N_2$) atmosphere.

After the crystallization of the first dielectric layers $304a_1'$, the second dielectric layers $304a_2'$, and the intermediate dielectric layers $304b'$, the thermal conductivity of each of these layers is further improved. In some embodiments, the intermediate dielectric layers $304b'$ are in direct contact with the first dielectric layers $304a_1'$ and the second dielectric layers $304a_2'$. In some embodiments, the first dielectric layers $304a_1'$ and the second dielectric layers $304a_2'$ are made of aluminum oxide and have a thermal conductivity of about 23 W/mK. In some embodiments, the intermediate dielectric layers $304b'$ are made of aluminum oxynitride and have a thermal conductivity that is higher than that of the of the first dielectric layers $304a_1'$ and/or the second dielectric layers $304a_2'$. For example, the intermediate dielectric layers $304b'$ may have a thermal conductivity of about 170 W/mK.

The isolation structures $304c$ may therefore greatly enhance the heat dissipation of the semiconductor device structure. The temperature induced operation shift and/or temperature induced lifetime degradation of device elements are prevented or mitigated. The first dielectric layers $304a_1'$ and the second dielectric layers $304a_2'$ also have low electronic leakage. Therefore, leakage current between the subsequently formed source/drain structures through the bottom of the semiconductor device structure may also be reduced or prevented. The performance and reliability of the semiconductor device structure are greatly improved.

However, embodiments of the disclosure are not limited thereto. Many variations and/or modifications can be made to embodiments of the disclosure. In some other embodiments, the isolation structures $304c$ are not crystallized. In some embodiments, the first dielectric layers $304a_1$, the second dielectric layers $304a_2$, and the intermediate dielectric layers 304b that are not annealed but have acceptable thermal conductivity together function as an isolation structure.

Figure 3G:
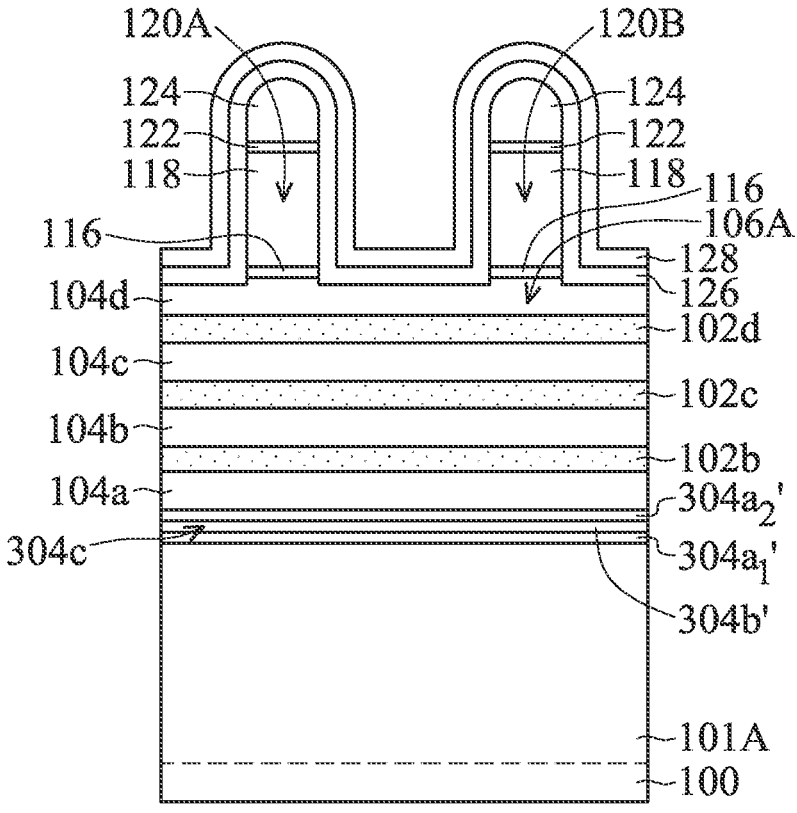

Afterwards, as shown in FIG. 3G, spacer layers 126 and 128 are deposited over the structure shown in FIG. 3F, in accordance with some embodiments. The spacer layers 126 and 128 extend along the sidewalls of the dummy gate stacks 120A and 120B. The spacer layers 126 and 128 are made of different materials. The spacer layer 126 may be made of a dielectric material that has a low dielectric constant. The spacer layer 126 may be made of or include silicon carbide, silicon oxycarbide, silicon oxide, one or more other suitable materials, or a combination thereof. The spacer layer 128 may be made of a dielectric material that can provide more protection to the gate stacks during subsequent processes. The spacer layer 128 may have a greater dielectric constant than that of the spacer layer 126. The spacer layer 128 may be made of silicon nitride, silicon oxynitride, carbon-containing silicon nitride, carbon-containing silicon oxynitride, one or more other suitable materials, or a combination thereof. The spacer layers 126 and 128 may be sequentially deposited using a CVD process, an ALD process, a physical vapor deposition (PVD) process, one or more other applicable processes, or a combination thereof.

Figure 3H:
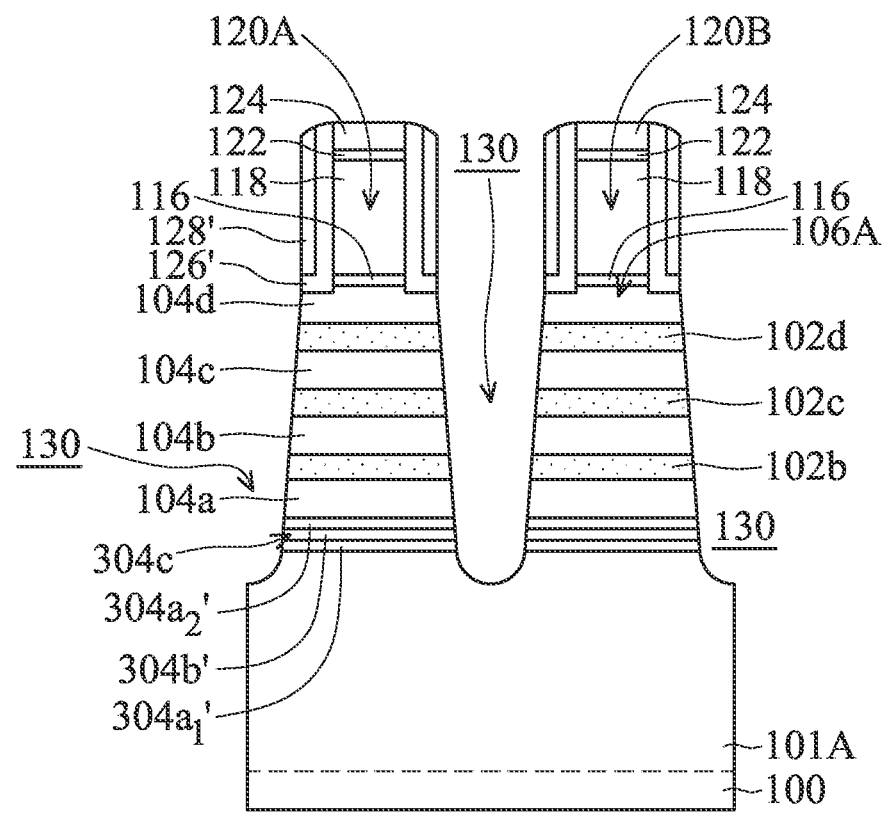

As shown in FIG. 3H, the spacer layers 126 and 128 are partially removed, in accordance with some embodiments. One or more anisotropic etching processes may be used to partially remove the spacer layers 126 and 128. As a result, remaining portions of the spacer layers 126 and 128 form spacer elements 126' and 128', respectively. The spacer elements 126' and 128' extend along the sidewalls of the dummy gate stacks 120A and 120B, as shown in FIG. 3H.

The fin structures 106A and 106B are partially removed to form recesses 130 that are used to contain epitaxial structures (such as source/drain structures) that will be formed later. As shown in FIG. 3H, the fin structures 106A and 106B are partially removed to form the recesses 130, in accordance with some embodiments. One or more etching processes may be used to form the recesses 130. In some embodiments, the recesses 130 extend through the fin structures 106A and 106B and the isolation structures 304c. In some embodiments, the recesses 130 further extend into the semiconductor fin 101A (as shown in FIG. 3H) and semiconductor fin 101B. In some embodiments, the spacer elements 126' and 128' and the recesses 130 are simultaneously formed using the same etching process.

In some embodiments, each of the recesses 130 has slanted sidewalls. Upper portions of the recesses 130 are larger (or wider) than lower portions of the recesses 130. In these cases, due to the profile of the recesses 130, an upper semiconductor layer (such as the semiconductor layer 104d) is shorter than a lower semiconductor layer (such as the semiconductor layer 104a) of fin structures 106A and 106B.

However, embodiments of the disclosure have many variations. In some other embodiments, the recesses 130 have substantially vertical sidewalls. In these cases, due to the profile of the recesses 130, an upper semiconductor layer (such as the semiconductor layer 104d) is substantially as wide as a lower semiconductor layer (such as the semiconductor layer 104a) of fin structures 106A and 106B.

Figure 3I:
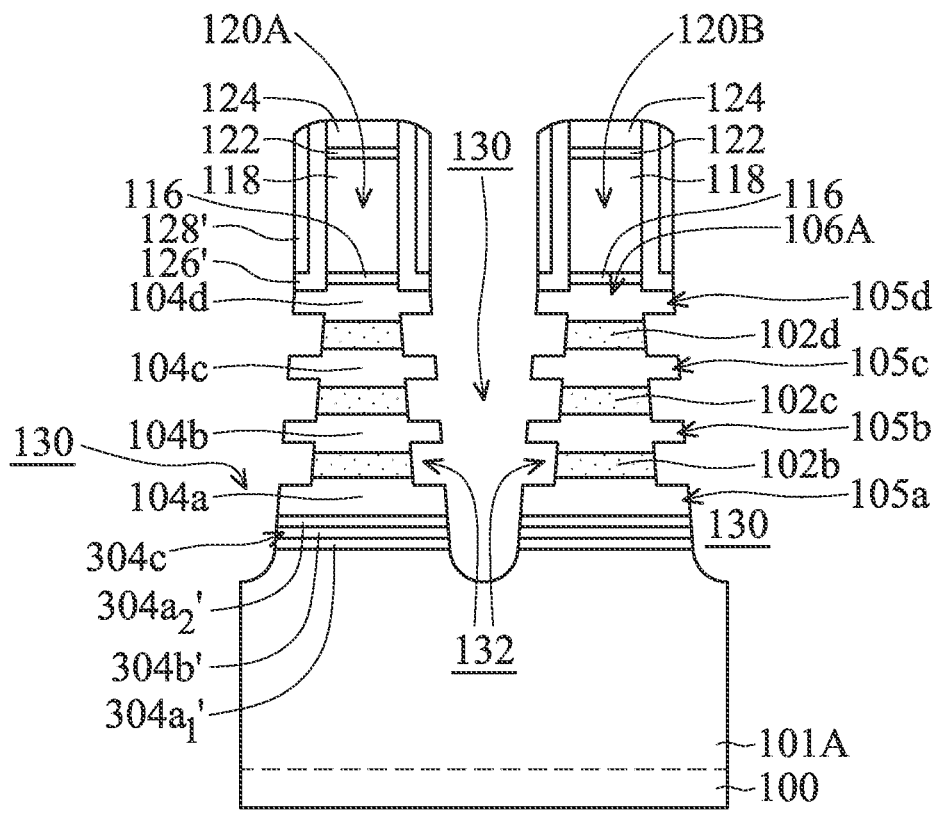

As shown in FIG. 3I, the semiconductor layers 102b-102d are laterally etched, in accordance with some embodiments. As a result, edges of the semiconductor layers 102b-102d retreat from edges of the semiconductor layers 104a-104d. As shown in FIG. 3I, recesses 132 are formed due to the lateral etching of the semiconductor layers 102b-102d. The recesses 132 may be used to contain inner spacers that will be formed later. The semiconductor layers 102b-102d may be laterally etched using a wet etching process, a dry etching process, or a combination thereof.

During the lateral etching of the semiconductor layers 102b-102d, the semiconductor layers 104a-104d may also be slightly etched. As a result, edge portions of the semiconductor layers 104a-104d are partially etched and thus shrink to become edge elements 105a-105d, as shown in FIG. 3I. As shown in FIG. 3I, each of the edge elements 105a-105d of the semiconductor layers 104a-104d is thinner than the corresponding inner portion of the semiconductor layers 104a-104d.

Figure 3J:
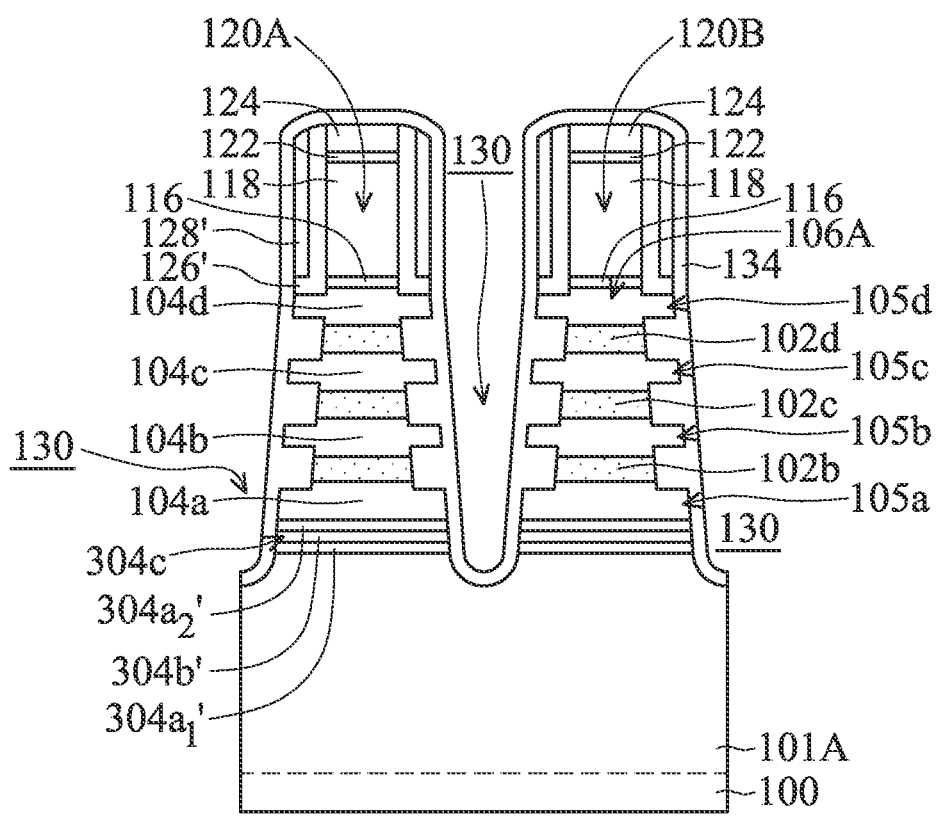

As shown in FIG. 3J, a spacer layer 134 is deposited over the structure shown in FIG. 3I, in accordance with some embodiments. The spacer layer 134 covers the dummy gate stacks 120A and 120B and overfills the recesses 132. The spacer layer 134 may be made of or include carbon-containing silicon nitride (SiCN), carbon-containing silicon oxynitride (SiOCN), carbon-containing silicon oxide (SiOC), one or more other suitable materials, or a combination thereof. The spacer layer 134 may be deposited using a CVD process, an ALD process, one or more other applicable processes, or a combination thereof.

Figure 3K:
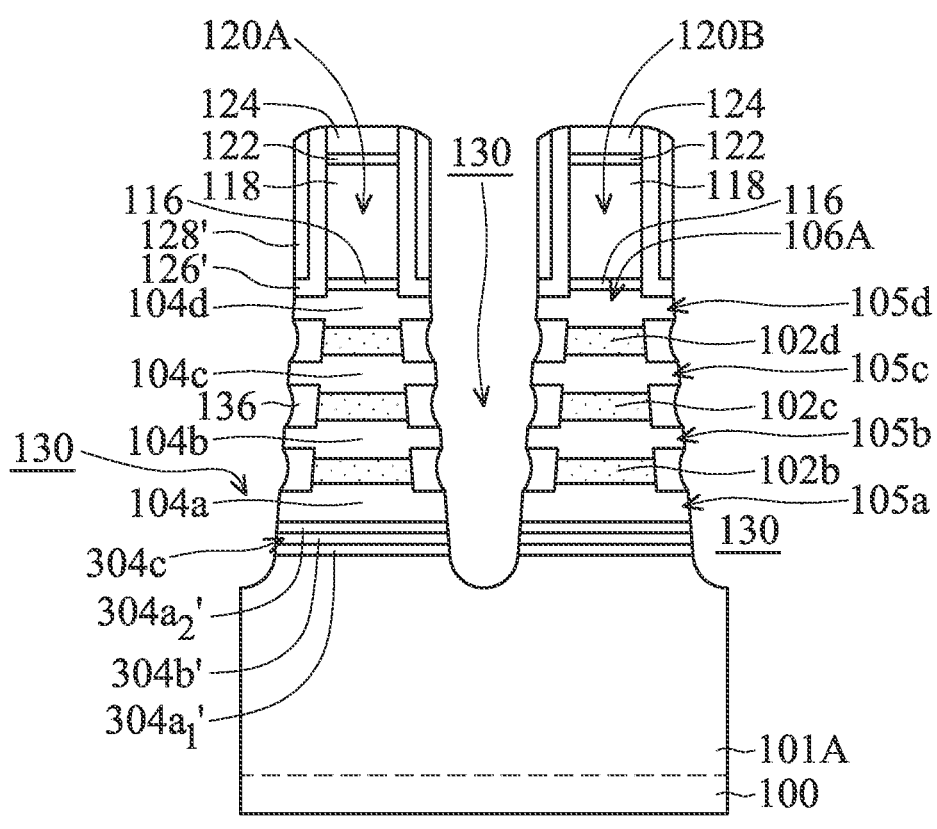

As shown in FIG. 3K, an etching process is used to partially remove the spacer layer 134, in accordance with some embodiments. The remaining portions of the spacer layer 134 form inner spacers 136, as shown in FIG. 3K. The etching process may include a dry etching process, a wet etching process, or a combination thereof.

The inner spacers 136 cover the edges of the semiconductor layers 102b-102d that are originally exposed by the recesses 132. The inner spacers 136 may be used to prevent subsequently formed epitaxial structures (that function as, for example, source/drain structures) from being damaged during a subsequent removing process of the semiconductor layers 102b-102d. The inner spacers 136 may also be used to reduce parasitic capacitance between the subsequently formed source/drain structures and the gate stacks. As a result, the operation speed of the semiconductor device structure may be improved.

In some embodiments, after the etching process for forming the inner spacers 136, portions of the semiconductor fin 101A originally covered by the spacer layer 134 are exposed by the recesses 130, as shown in FIG. 3K. Similarly, the sidewalls of the isolation structures 304c, that are originally covered by the spacer layer 134, are also exposed by the recesses 130, as shown in FIG. 3K. The sidewalls of the edge elements 105a-105d, that are originally covered by the spacer layer 134, are also exposed by the recesses 130.

Figure 3L:
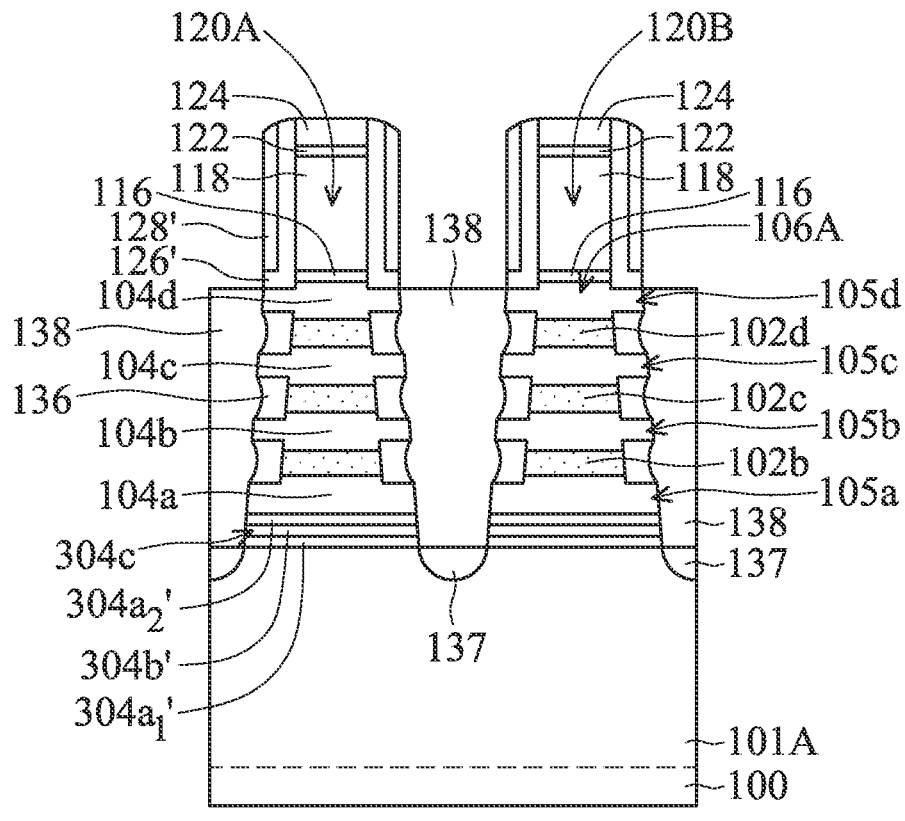

As shown in FIG. 3L, epitaxial structures 138 are formed beside the dummy gate stacks 120A and 120B, in accordance with some embodiments. In some embodiments, the epitaxial structures 138 fill the recesses 130, as shown in FIG. 3L. In some other embodiments, the epitaxial structures 138 overfill the recesses 130. In these cases, the top surfaces of the epitaxial structures 138 may be higher than the top surface of the dummy gate dielectric layers 116. In some other embodiments, the epitaxial structures 138 partially fill the recesses 130. For example, the epitaxial structures 138 extend along the sidewalls of the recesses 130 and surround the remaining portions of the recesses 130 that are not occupied by the epitaxial structures 138.

In some embodiments, the epitaxial structures 138 connect to the semiconductor layers 104a-104d. Each of the semiconductor layers 104a-104d is sandwiched between two of the epitaxial structures 138. In some embodiments, the epitaxial structures 138 function as source/drain structures. In some embodiments, the epitaxial structures 138 are p-type doped regions. The epitaxial structures 138 may include epitaxially grown silicon germanium (SiGe), epitaxially grown silicon, or another suitable epitaxially grown semiconductor material. In some other embodiments, the epitaxial structures 138 are n-type regions. The epitaxial structures 138 may include epitaxially grown silicon, epitaxially grown silicon carbide (SiC), epitaxially grown silicon phosphide (SiP), or another suitable epitaxially grown semiconductor material. In some embodiments, the epitaxial structures 138 are formed using a selective epitaxial growth (SEG) process, a CVD process (e.g., a vapor-phase epitaxy (VPE) process, a low-pressure chemical vapor deposition (LPCVD) process, and/or an ultra-high vacuum CVD (UHV-CVD) process), a molecular beam epitaxy process, one or more other applicable processes, or a combination thereof.

In some embodiments, the epitaxial structures 138 are doped with one or more suitable dopants. For example, the epitaxial structures 138 are SiGe source/drain features or Si source/drain features that are doped with boron (B), gallium (Ga), indium (In), another suitable dopant, or a combination thereof. In some other embodiments, the epitaxial structures 138 are Si source/drain features doped with phosphorous (P), antimony (Sb), another suitable dopant, or a combination thereof.

In some embodiments, before the formation of the epitaxial structures 138, isolation elements 137 are formed to fill bottom portions of the recesses 130, as shown in FIG. 3L. The isolation elements 137 are used to prevent or reduce current leakage from the epitaxial structures 138. In some embodiments, the isolation elements 137 are made of a semiconductor material. The isolation elements 137 may be made of or include silicon germanium, silicon, one or more other suitable materials, or a combination thereof.

In some embodiments, the doping concentration of the isolation elements 137 is much lower than that of the epitaxial structures 138. Therefore, current from the epitaxial structures 138 is isolated by the isolation elements 137 and is prevented from entering the semiconductor fins 101A or 101B. In some other embodiments, the isolation elements 137 contain substantially no dopant. In these cases, the doping concentration of isolation elements 137 is substantially equal to zero.

In some embodiments, the isolation elements 137 and the epitaxial structures 138 are formed in-situ in the same process chamber. The vacuum of the process chamber is not broken after the formation of the isolation elements 137 and before the formation of the epitaxial structures 138.

In some embodiments, the epitaxial structures 138 are doped in-situ during their epitaxial growth. The initial reaction gas mixture for forming the epitaxial structures 138 contains dopants. In some other embodiments, the epitaxial structures 138 are not doped during the growth of the epitaxial structures 138. Instead, after the formation of the epitaxial structures 138, the epitaxial structures 138 are doped in a subsequent process. In some embodiments, the doping is achieved by using an ion implantation process, a plasma immersion ion implantation process, a gas and/or solid source diffusion process, one or more other applicable processes, or a combination thereof. In some embodiments, the epitaxial structures 138 are further exposed to one or more annealing processes to activate the dopants. For example, a rapid thermal annealing process is used.

Figure 3M:
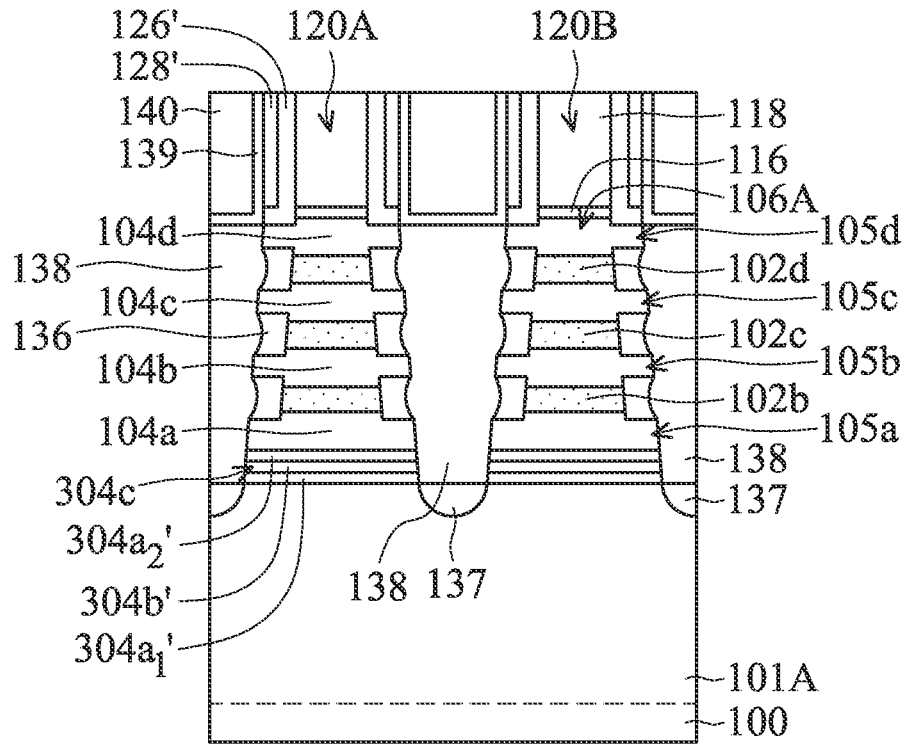

As shown in FIG. 3M, a contact etch stop layer 139 and a dielectric layer 140 are formed to cover the epitaxial structures 138 and to surround the dummy gate stacks 120A and 120B, in accordance with some embodiments. The contact etch stop layer 139 may be made of or include silicon nitride, silicon oxynitride, silicon carbide, aluminum oxide, one or more other suitable materials, or a combination thereof. The dielectric layer 140 may be made of or include silicon oxide, silicon oxynitride, borosilicate glass (BSG), phosphoric silicate glass (PSG), borophosphosilicate glass (BPSG), fluorinated silicate glass (FSG), low-k material, porous dielectric material, one or more other suitable materials, or a combination thereof.

In some embodiments, an etch stop material layer and a dielectric material layer are sequentially deposited over the structure shown in FIG. 3L. The etch stop material layer may be deposited using a CVD process, an ALD process, a PVD process, one or more other applicable processes, or a combination thereof. The dielectric material layer may be deposited using an FCVD process, a CVD process, an ALD process, one or more other applicable processes, or a combination thereof.

Afterwards, a planarization process is used to partially remove the etch stop material layer and the dielectric material layer. As a result, the remaining portions of the etch stop material layer and the dielectric material layer form the contact etch stop layer 139 and the dielectric layer 140, respectively. The planarization process may include a CMP process, a grinding process, an etching process, a dry polishing process, one or more other applicable processes, or a combination thereof.

In some embodiments, the mask layers 122 and 124 are removed during the planarization process. In some embodiments, after the planarization process, the top surfaces of the contact etch stop layer 139, the dielectric layer 140, and the dummy gate electrodes 118 are substantially level with each other.

Figure 2J:
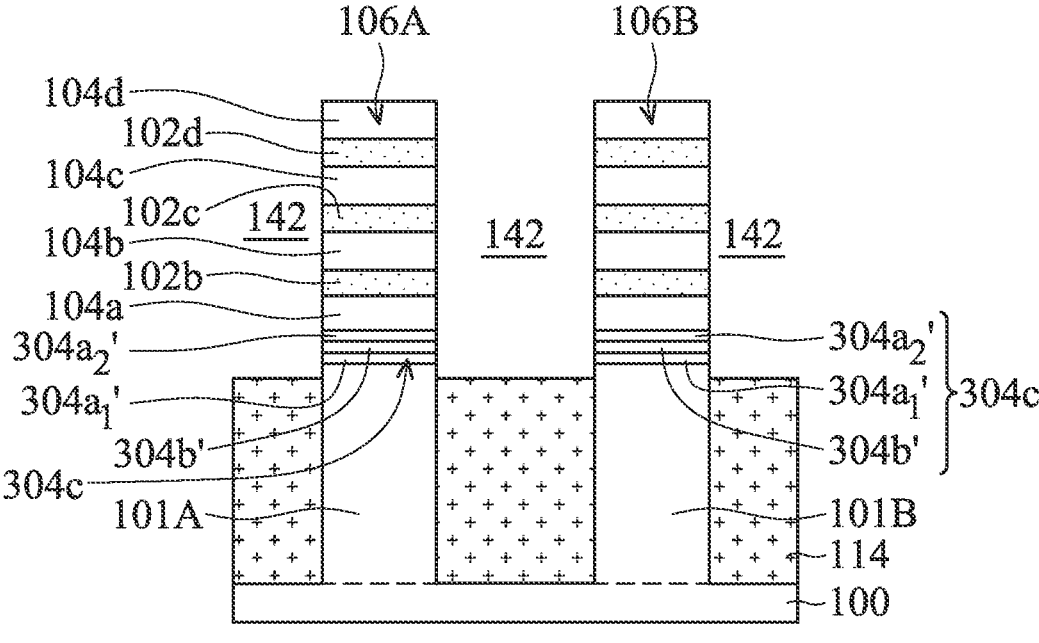
Figure 3N:
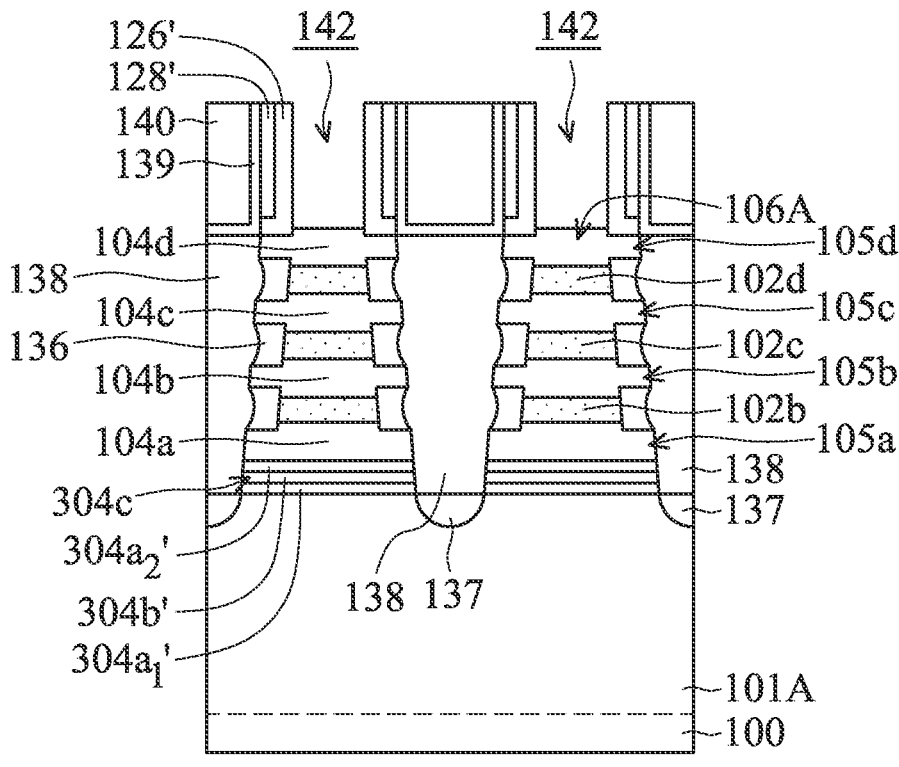

Afterwards, as shown in FIGS. 2J and 3N, one or more etching processes are used to remove the dummy gate stacks 120A and 120B to form trenches 142, in accordance with some embodiments. The trenches 142 (i.e., gate openings) expose the isolation structures 304c and the semiconductor layers 102b-102d and 104a-104d that are originally covered by the dummy gate stacks 120A and 120B, as shown in FIG. 2J.

Figure 2K:
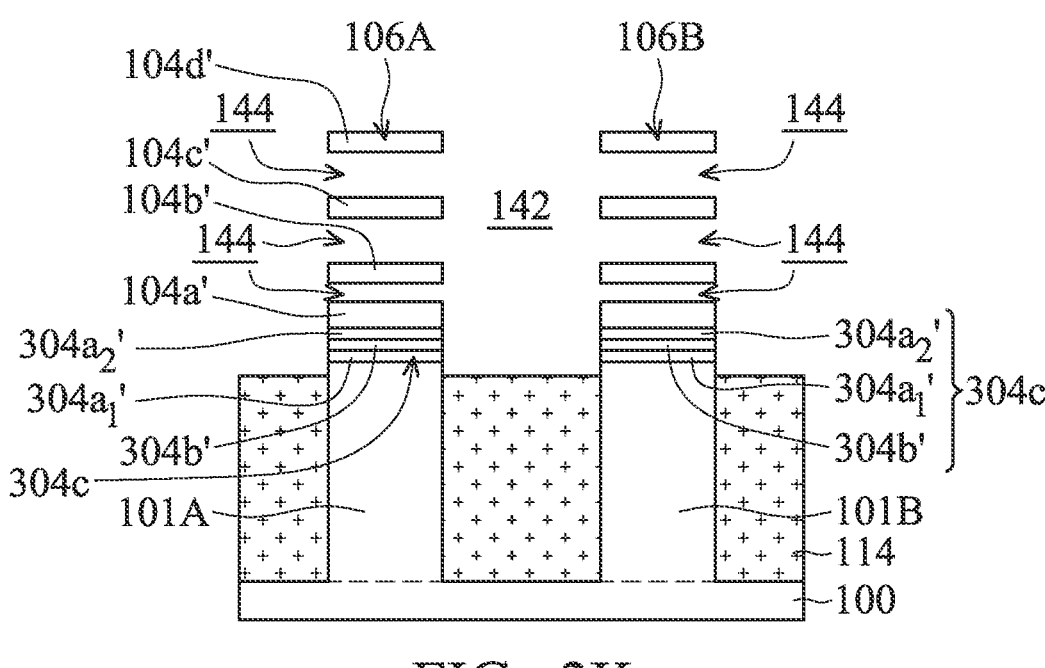
Figure 3O:
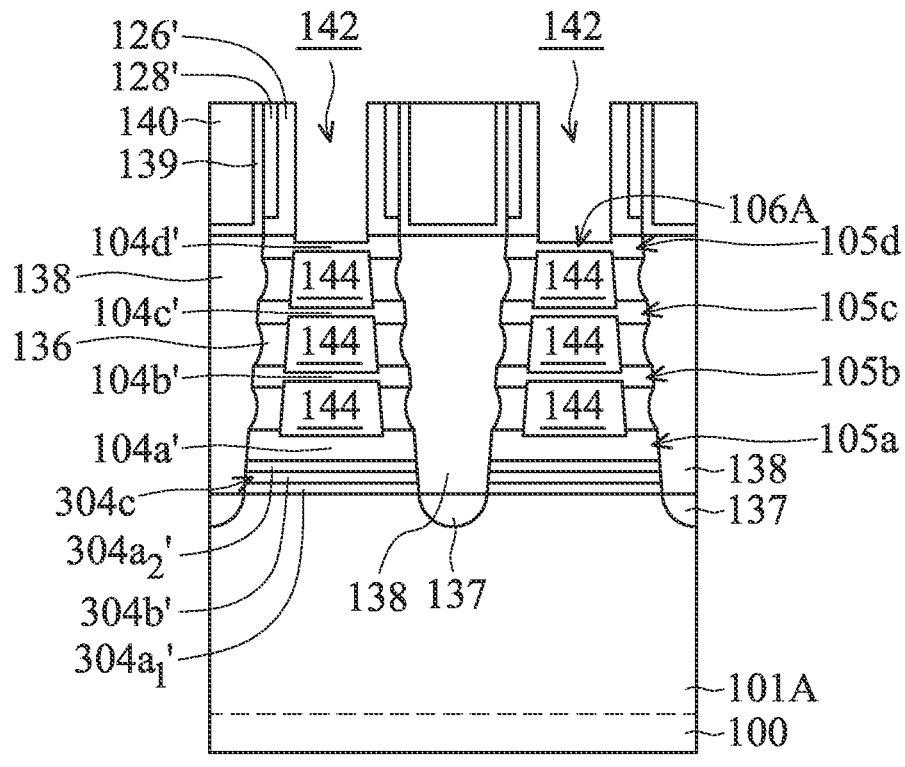
Figure 3P:
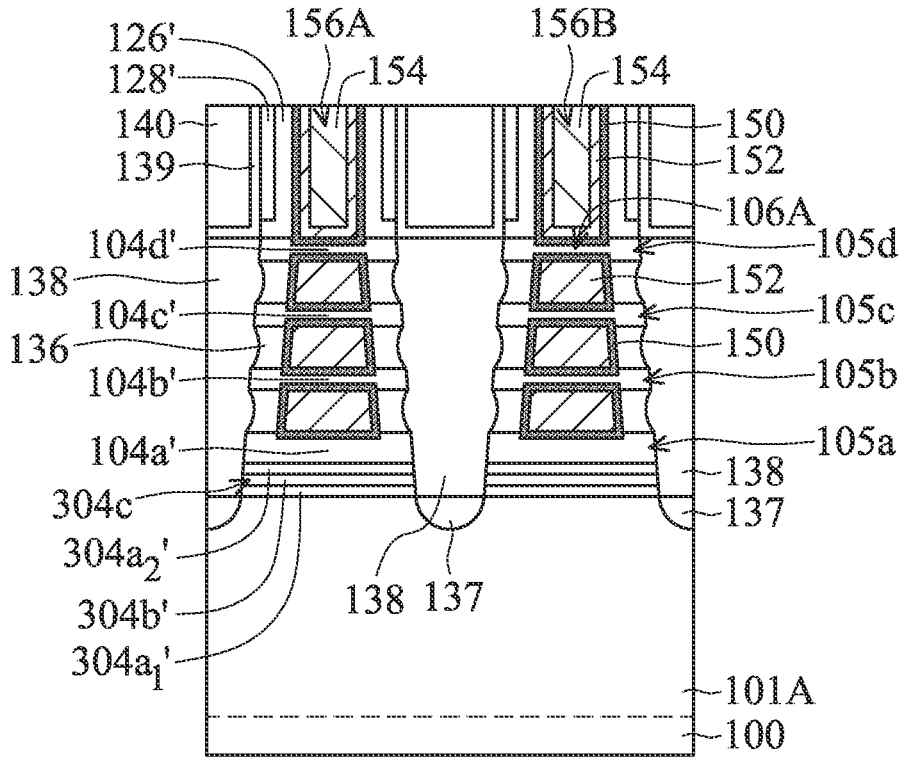

As shown in FIGS. 2K and 3O, the semiconductor layers 102b-102d (that function as sacrificial layers) are removed to form recesses 144, in accordance with some embodiments. In some embodiments, an etching process is used to remove the semiconductor layers 102b-102d. Due to high etching selectivity, the semiconductor layers 104a-104d are only slightly etched or completely not etched. The remaining portions of the semiconductor layers 104a-104d form multiple semiconductor nanostructures 104a'-104d' of the fin structures 106A and 106B, as shown in FIGS. 2K and 3O. The semiconductor nanostructures 104a'-104d' are constructed by or made up of the remaining portions of the semiconductor layer 104a-104d. The semiconductor nanostructures 104a'-104d' suspended over the semiconductor fins 101A and 101B, respectively, may function as channel structures of one or more transistors.

In some embodiments, the etchant used for removing the semiconductor layers 102b-102d also slightly removes the semiconductor layers 104a-104d that form the semiconductor nanostructures 104a'-104d'. As a result, the obtained semiconductor nanostructures 104a'-104d' become thinner after the removal of the semiconductor layers 102b-102d. In some embodiments, each of the semiconductor nanostructures 104a'-104d' is thinner than the edge elements 105a-

105*d* since the edge elements 105*a*-105*d* are surrounded by other elements and thus are prevented from being reached and etched by the etchant.

After the removal of the semiconductor layers 102*b*-102*d* (that function as sacrificial layers), recesses 144 are formed. The recesses 144 connect to the trench 142 and surround each of the semiconductor nanostructures 104*a'*-104*d'*. As shown in FIG. 3O, even if the recesses 144 between the semiconductor nanostructures 104*a'*-104*d'* are formed, the semiconductor nanostructures 104*a'*-104*d'* remain being held by the epitaxial structures 138. Therefore, after the removal of the semiconductor layers 102*b*-102*d* (that function as sacrificial layers), the released semiconductor nanostructures 104*a'*-104*d'* are prevented from falling down.

During the removal of the semiconductor layers 102*b*-102*d* (that function as sacrificial layers), the inner spacers 136 protect the epitaxial structures 138 from being etched or damaged. The quality and reliability of the semiconductor device structure are improved.

Figure 2L:
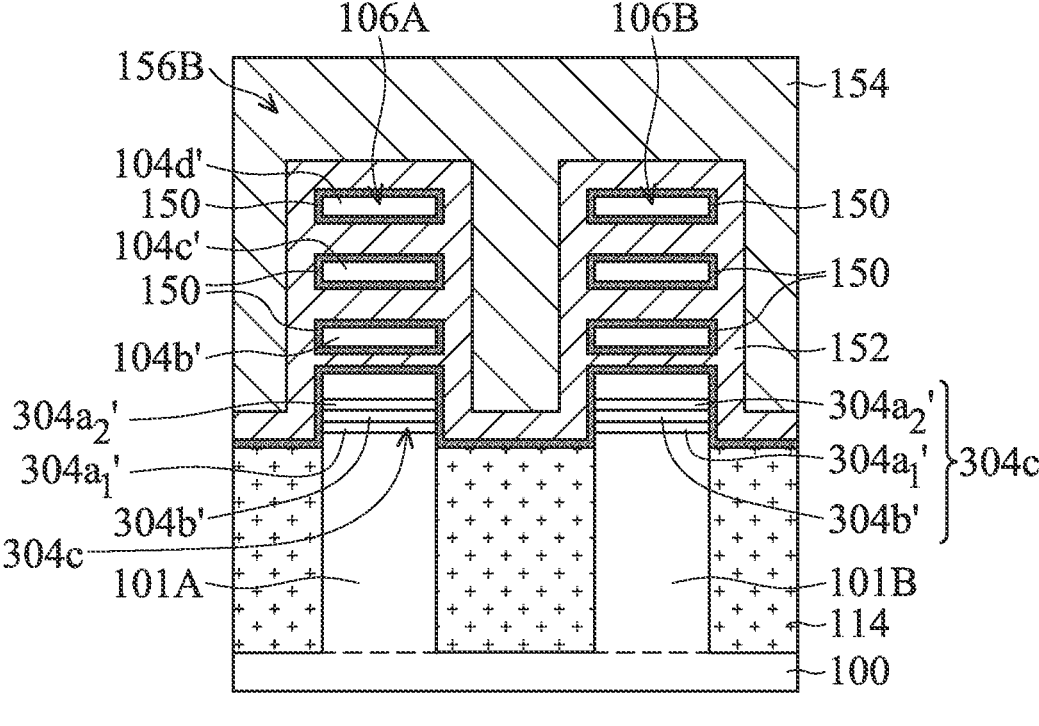

As shown in FIGS. 2L and 3P, metal gate stacks 156A and 156B are formed to fill the trenches 142, in accordance with some embodiments. The metal gate stacks 156A and 156B extend into the recesses 144 to wrap around each of the semiconductor nanostructures 104*a'*-104*d'*. In some embodiments, each of the isolation structures 304*c* is in direct contact with the corresponding semiconductor fin 101A or 101B, the corresponding epitaxial structure 138, and/or the corresponding metal gate stack 156A or 156B, as shown in FIGS. 2L and 3P.

Each of the metal gate stacks 156A and 156B includes multiple metal gate stack layers. Each of the metal gate stacks 156A and 156B may include a gate dielectric layer 150, a work function layer 152, and a conductive filling 154. In some embodiments, the formation of the metal gate stacks 156A and 156B involves the deposition of multiple metal gate stack layers over the dielectric layer 140 to fill the trenches 142 and the recesses 144. The metal gate stack layers extend into the recesses 144 to wrap around each of the semiconductor nanostructures 104*a'*-104*d'*.

In some embodiments, the gate dielectric layer 150 is made of or includes a dielectric material with high dielectric constant (high-K). The gate dielectric layer 150 may be made of or include hafnium oxide, zirconium oxide, aluminum oxide, hafnium dioxide-alumina alloy, hafnium silicon oxide, hafnium silicon oxynitride, hafnium tantalum oxide, hafnium titanium oxide, hafnium zirconium oxide, one or more other suitable high-K materials, or a combination thereof. The gate dielectric layer 150 may be deposited using an ALD process, a CVD process, one or more other applicable processes, or a combination thereof. The formation of the gate dielectric layer 150 may further involve one or more thermal operations.

In some embodiments, before the formation of the gate dielectric layer 150, interfacial layers are formed on the surfaces of the semiconductor nanostructures 104*a'*-104*d'*. The interfacial layers are very thin and are made of, for example, silicon oxide or germanium oxide. In some embodiments, the interfacial layers are formed by applying an oxidizing agent on the surfaces of the semiconductor nanostructures 104*a'*-104*d'*. For example, a hydrogen peroxide-containing liquid may be applied or provided on the surfaces of the semiconductor nanostructures 104*a'*-104*d'* so as to form the interfacial layers.

The work function layer 152 may be used to provide the desired work function for transistors to enhance device performance including improved threshold voltage. In some embodiments, the work function layer 152 is used for forming a PMOS device, and the work function layer 152 is a p-type work function layer. The p-type work function layer is capable of providing a work function value suitable for the device, such as equal to or greater than about 4.8 eV. The p-type work function layer may include metal, metal carbide, metal nitride, other suitable materials, or a combination thereof. For example, the p-type work function layer includes tantalum nitride, tungsten nitride, titanium, titanium nitride, one or more other suitable materials, or a combination thereof.

In some embodiments, the work function layer 152 is used for forming an NMOS device, and the work function layer 152 is an n-type work function layer. The n-type work function layer is capable of providing a work function value suitable for the device, such as equal to or less than about 4.5 eV. The n-type work function layer may include metal, metal carbide, metal nitride, or a combination thereof. For example, the n-type work function layer includes titanium nitride, tantalum, tantalum nitride, one or more other suitable materials, or a combination thereof. In some embodiments, the n-type work function layer is an aluminum-containing layer. The aluminum-containing layer may be made of or include TiAlC, TiAlO, TiAlN, one or more other suitable materials, or a combination thereof.

The work function layer 152 may also be made of or include hafnium, zirconium, titanium, tantalum, aluminum, metal carbides (e.g., hafnium carbide, zirconium carbide, titanium carbide, aluminum carbide), aluminides, ruthenium, palladium, platinum, cobalt, nickel, conductive metal oxides, or a combination thereof. The thickness and/or the compositions of the work function layer 152 may be fine-tuned to adjust the work function level. The work function layer 152 may be deposited over the gate dielectric layer 150 using an ALD process, a CVD process, a PVD process, an electroplating process, an electroless plating process, one or more other applicable processes, or a combination thereof.

In some embodiments, a barrier layer is formed before the work function layer 152 to allow the gate dielectric layer 150 to interface with the subsequently formed work function layer 152. The barrier layer may also be used to prevent diffusion between the gate dielectric layer 150 and the subsequently formed work function layer 152. The barrier layer may be made of or include a metal-containing material. The metal-containing material may include titanium nitride, tantalum nitride, one or more other suitable materials, or a combination thereof. The barrier layer may be deposited using an ALD process, a CVD process, a PVD process, an electroplating process, an electroless plating process, one or more other applicable processes, or a combination thereof.

In some embodiments, the conductive filling 154 is made of or include a metal material. The metal material may include tungsten, aluminum, copper, cobalt, one or more other suitable materials, or a combination thereof. A conductive layer used for forming the conductive filling 154 may be deposited over the work function layer 152 using a CVD process, an ALD process, a PVD process, an electroplating process, an electroless plating process, a spin coating process, one or more other applicable processes, or a combination thereof.

In some embodiments, a blocking layer is formed over the work function layer 152 before the formation of the conductive layer used for forming the conductive filling 154. The blocking layer may be used to prevent the subsequently formed conductive layer from diffusing or penetrating into the work function layer 152. The blocking layer may be made of or include tantalum nitride, titanium nitride, one or more other suitable materials, or a combination thereof. The blocking layer may be deposited using an ALD process, a PVD process, an electroplating process, an electroless plating process, one or more other applicable processes, or a combination thereof.

Afterwards, a planarization process is performed to remove the portions of the metal gate stack layers outside of the trenches 142, in accordance with some embodiments. As a result, the remaining portions of the metal gate stack layers form the metal gate stacks 156A and 156B, as shown in FIGS. 2L and 3P. In some embodiments, the conductive filling 154 does not extend into the recesses 144 since the recesses 144 are small and have been filled with other elements such as the gate dielectric layer 150 and the work function layer 152. However, embodiments of the disclosure are not limited thereto. In some other embodiments, a portion of the conductive filling 154 extends into the recesses 144, especially for the lower recesses 144 that may have larger space.

In some embodiments, the epitaxial structures 138 extend below the top surfaces of the isolation structures 304c and into the isolation structures 304c but not into semiconductor fins 101A and 101B. For example, the epitaxial structures 138 extend to the first dielectric layers 304a₁', the second dielectric layers 304a₂', or the intermediate dielectric layers 304b'. In some embodiments, the epitaxial structures 138 extend below interfaces between the isolation structures 304c and the metal gate stack 156A or 156B. In some embodiments, the epitaxial structures 138 extend below the bottom surfaces of the isolation structures 304c, such as depicted. The isolation structures 304c may help to reduce or prevent leakage current and to enhance heat dissipation of the semiconductor device structure. The performance and reliability of the semiconductor device structure is significantly improved.

In some embodiments, each of the isolation structures 304c extend laterally beyond opposite edges of the corresponding metal gate stack 156A or 156B, as shown in FIG. 3P. The semiconductor nanostructures 104a'-104d' are positioned right above the corresponding isolation structure 304c.

In some embodiments, the isolation structures 304c are formed before the formation of the inner spacers 136, as shown in FIGS. 3A-3K. However, embodiments of the disclosure are not limited thereto. Many variations and/or modifications can be made to embodiments of the disclosure. In some other embodiments, the isolation structures 304c are formed after the formation of the inner spacers 136 and before the formation of the epitaxial structures 138.

Figure 4A:
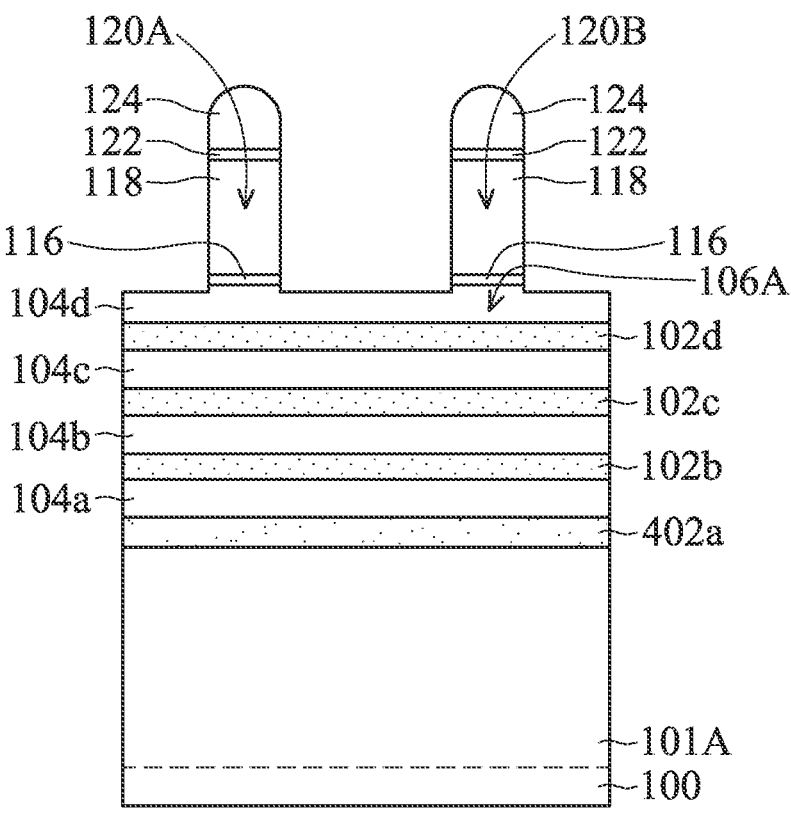
FIGS. 4A-4I are cross-sectional views of various stages of a process for forming a portion of a semiconductor device structure, in accordance with some embodiments.

FIGS. 4A-4I are cross-sectional views of various stages of a process for forming a portion of a semiconductor device structure, in accordance with some embodiments. As shown in FIG. 4A, a structure similar to that shown in FIG. 3A is formed. Similarly, the fin structure 106A includes multiple semiconductor layers 402a, 102b, 102c, and 102d and multiple semiconductor layers 104a, 104b, 104c, and 104d that are laid out alternately. In some embodiments, the semiconductor layer 402a is used as a sacrificial base layer and will be replaced with an isolation structure in a subsequent process.

In some embodiments, the semiconductor layer 402a has a different atomic concentration of germanium than that of the semiconductor layer 102b, 102c, or 102d. In some embodiments, unlike the semiconductor layer 102a illustrated in FIG. 3A, the semiconductor layer 402a has a lower atomic concentration of germanium than that of the semiconductor layers 102b, 102c, 102d, or a combination thereof. The lower atomic concentration of germanium of the semiconductor layer 402a enables the semiconductor layer 402a to have different etching selectivity to the semiconductor layers 102b, 102c, and 102d. In some embodiments, an etching rate of the semiconductor layer 402a to a given etchant is lower than an etching rate of the semiconductor layers 102b, 102c, and 102d to the given etchant.

Figure 4B:
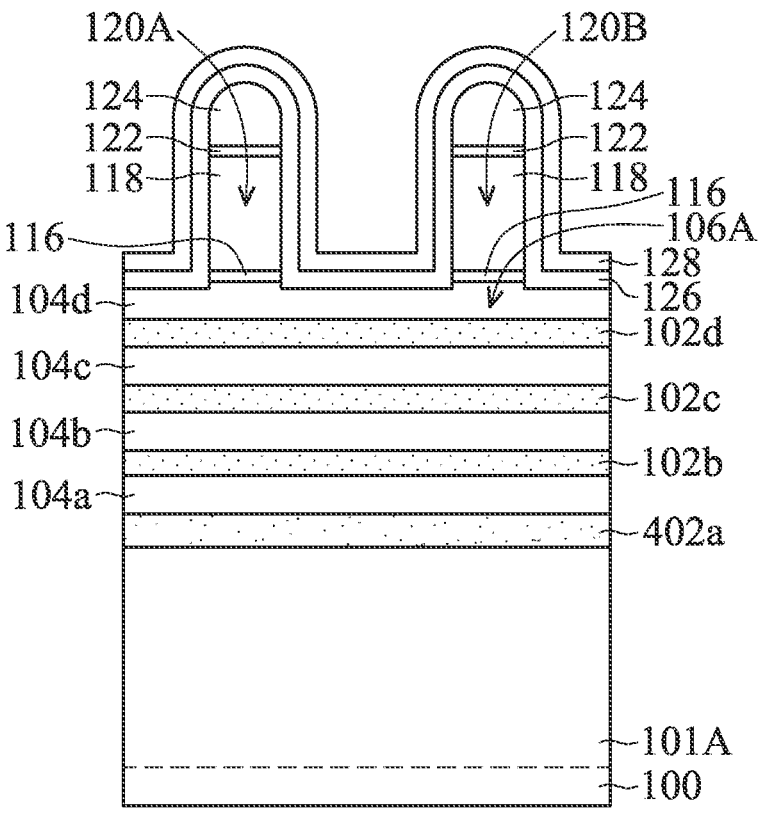

Afterwards, like the embodiments illustrated in FIG. 3G, spacer layers 126 and 128 are deposited over the structure shown in FIG. 4A, as shown in FIG. 4B in accordance with some embodiments. The materials and formation method of the spacer layers 126 and 128 may be the same as or similar to those of the spacer layers 126 and 128 shown in FIG. 3G.

Figure 4C:
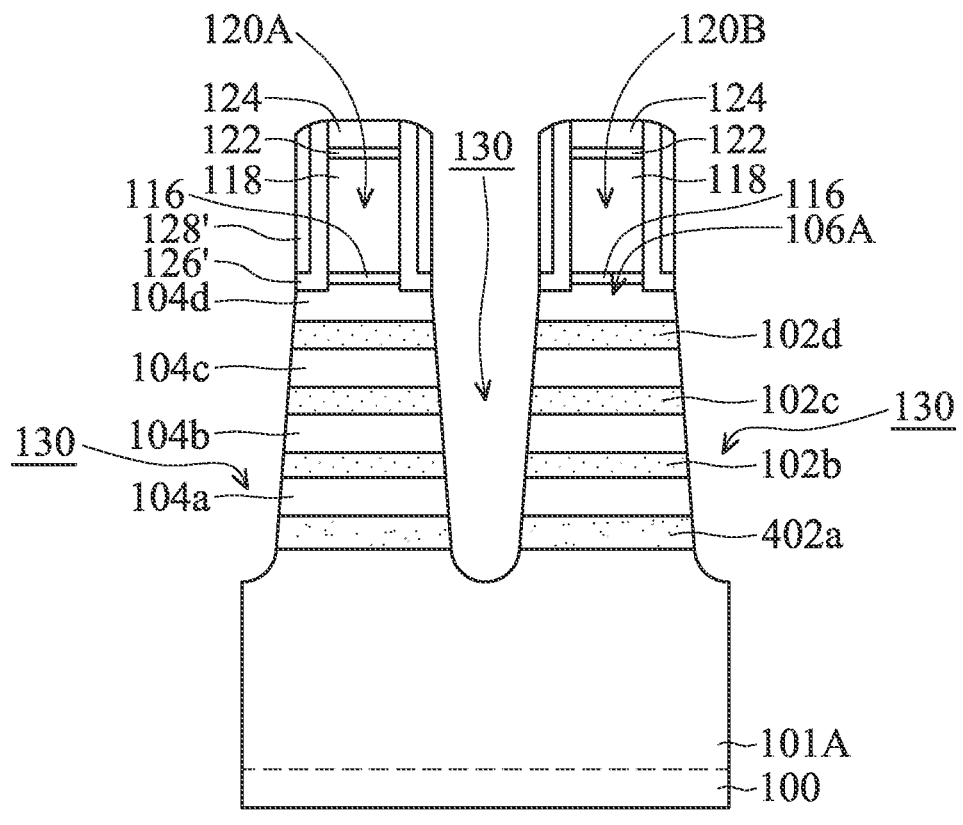

As shown in FIG. 4C, like the embodiments illustrated in FIG. 3H, the spacer layers 126 and 128 are partially removed, in accordance with some embodiments. As a result, remaining portions of the spacer layers 126 and 128 form spacer elements 126' and 128', respectively. The fin structures 106A and 106B are partially removed to form recesses 130. The recesses 130 are used to contain epitaxial structures (such as source/drain structures) that will be formed later.

Figure 4D:
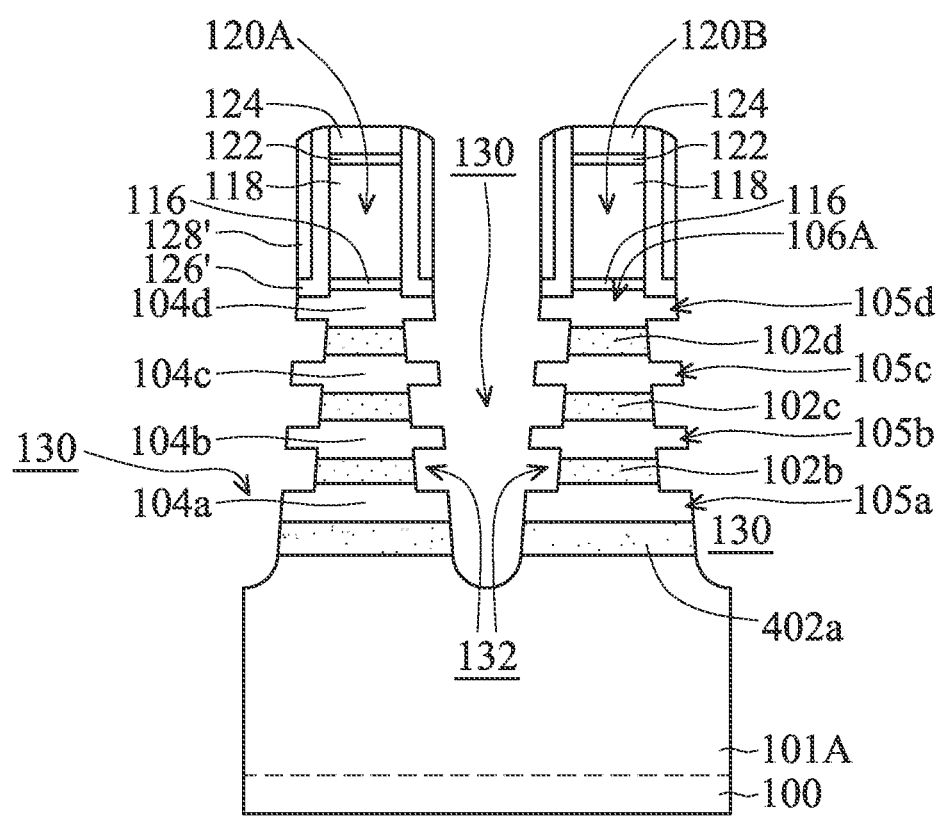

As shown in FIG. 4D, the semiconductor layers 102b-102d are laterally etched, in accordance with some embodiments. As a result, edges of the semiconductor layers 102b-102d retreat from edges of the semiconductor layers 104a-104d. As shown in FIG. 4D, recesses 132 are formed due to the lateral etching of the semiconductor layers 102b-102d. The recesses 132 may be used to contain inner spacers that will be formed later. The semiconductor layers 102b-102d may be laterally etched using a wet etching process, a dry etching process, or a combination thereof.

As mentioned above, in some embodiments, the semiconductor layer 402a has a lower atomic concentration of germanium than that of the semiconductor layers 102b, 102c, 102d, or a combination thereof. In some embodiments, the semiconductor layers 402a may slightly (or substantially not) be etched during the lateral etching of the semiconductor layers 102b-102d. As a result, there is substantially no recess formed at the sidewalls of the semiconductor layer 402a, as shown in FIG. 4D in accordance with some embodiments. During the lateral etching of the semiconductor layers 102b-102d, the semiconductor layers 104a-104d may also be slightly etched. As a result, edge portions of the semiconductor layers 104a-104d are partially etched and thus shrink to become edge elements 105a-105d, as shown in FIG. 4D.

Figure 4E:
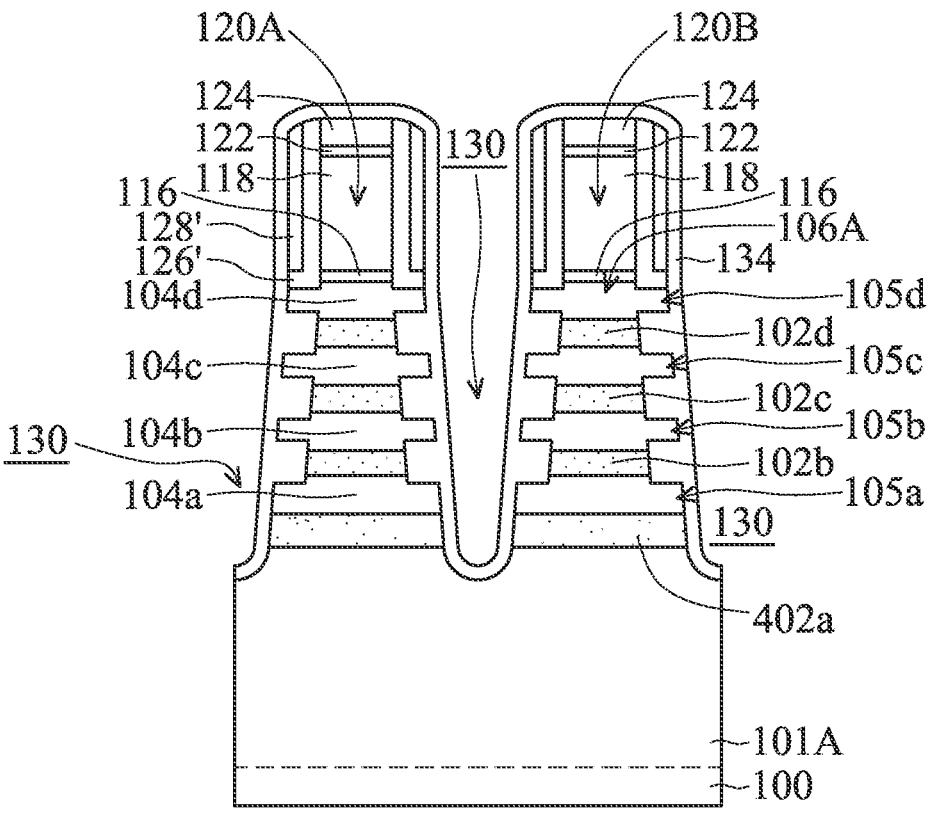

As shown in FIG. 4E, a spacer layer 134 is deposited over the structure shown in FIG. 4D, in accordance with some embodiments. The material and formation method of the spacer layer 134 may be the same as or similar to those of the spacer layer 134 illustrated in FIG. 3J.

Figure 4F:
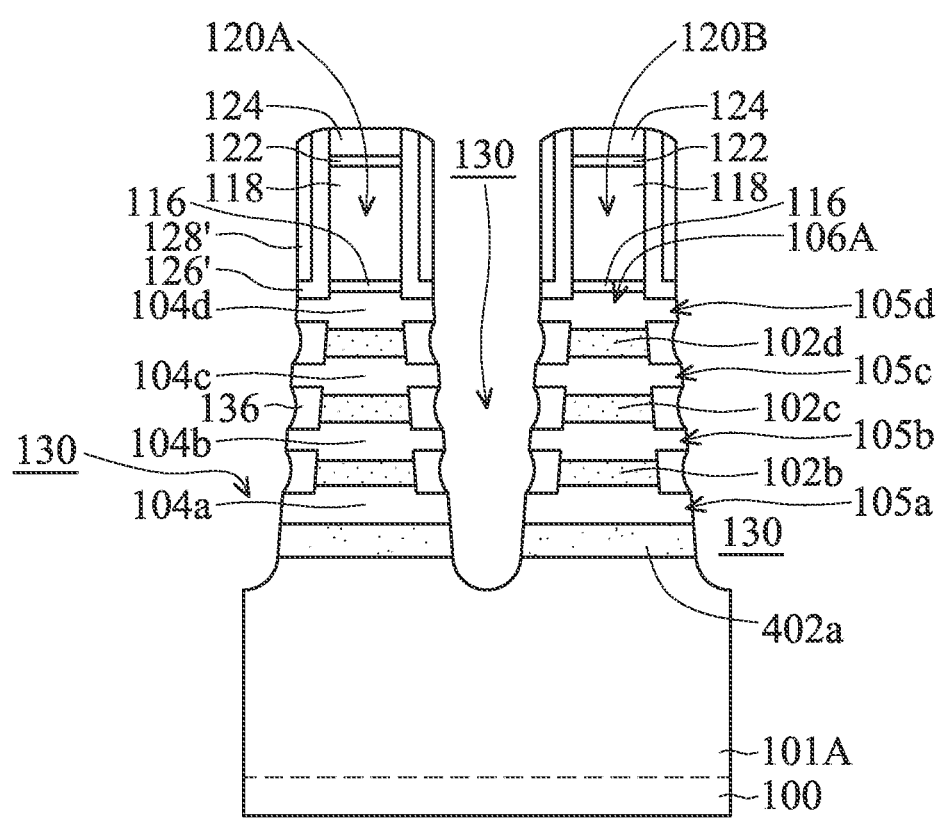

As shown in FIG. 4F, an etching process is used to partially remove the spacer layer 134, in accordance with some embodiments. The remaining portions of the spacer layer 134 form inner spacers 136, as shown in FIG. 4F. The etching process may include a dry etching process, a wet etching process, or a combination thereof.

The inner spacers 136 cover the edges of the semiconductor layers 102b-102d that are originally exposed by the recesses 132. In some embodiments, after the etching process for forming the inner spacers 136, portions of the semiconductor fin 101A originally covered by the spacer layer 134 are exposed by the recesses 130, as shown in FIG. 4F. Similarly, the sidewalls of the semiconductor layer 402a, that are originally covered by the spacer layer 134, are also exposed by the recesses 130, as shown in FIG. 4F. The inner spacers 136 are prevented from being formed over the sidewalls of the semiconductor layer 402a, which facilitates a subsequent removing process of the semiconductor layer 402a.

Figure 4G:
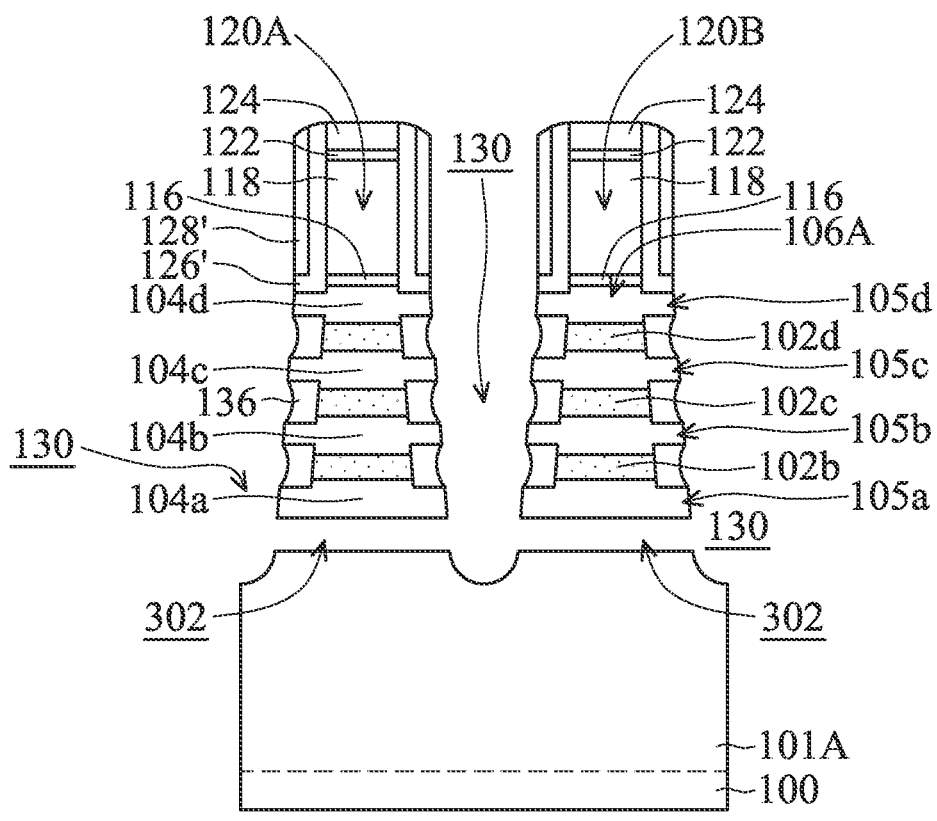

As shown in FIG. 4G, the semiconductor layers 402a are removed to form recesses 302 between the semiconductor layers 104a and the semiconductor fins 101A and 101B, respectively, in accordance with some embodiments. Due to the support of the dummy gate stacks 120A and 120B, the fin structures 106A and 106B are prevented from falling down even if the semiconductor layers 402a are removed. The semiconductor layers 402a may be removed using a dry etching process, a wet etching process, or a combination thereof. As shown in FIG. 4G, due to the protection of the inner spacers 136 and the semiconductor layer 104a, the semiconductor layers 102b-102d are prevented from being etched during removal of the semiconductor layers 402a.

Figure 4H:
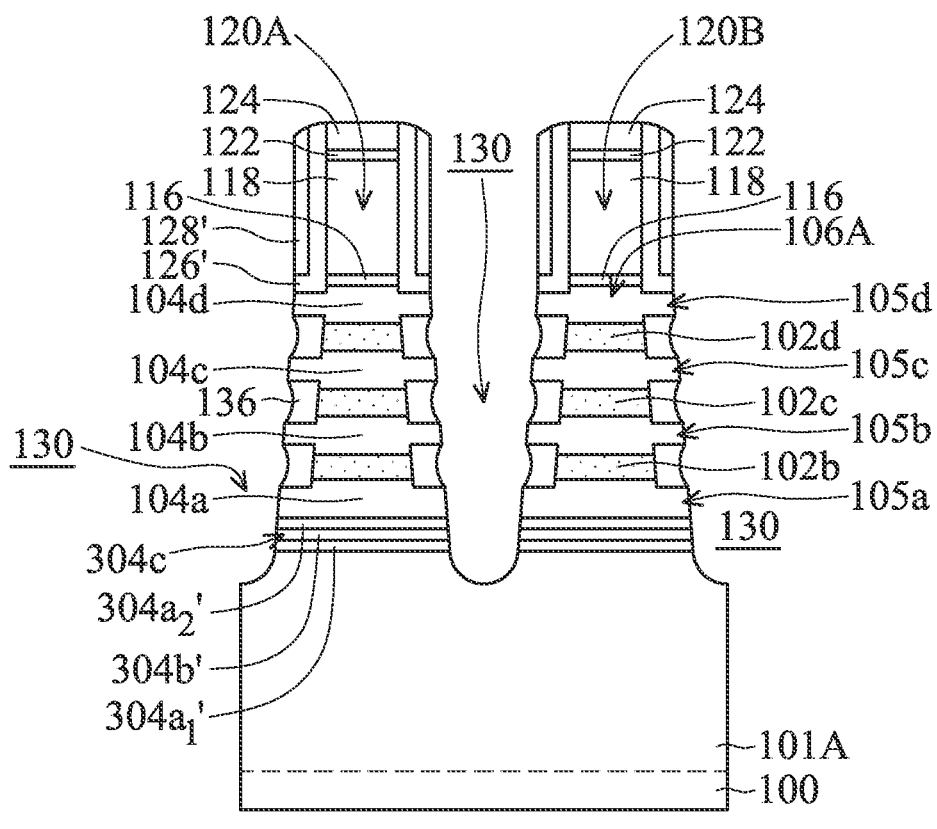

As shown in FIG. 4H, isolation structures 304c are formed in the recesses 302, in accordance with some embodiments. As shown in FIGS. 4F-4H, the semiconductor layers 402a (that function as sacrificial base layers) are replaced with the isolation structures 304c. In some embodiments, each isolation structure 304c includes a respective first dielectric layer 304a₁', a respective second dielectric layer 304a₂', and a respective intermediate dielectric layer 304b'. The materials and formation method of the isolation structures 304c may be the same as or similar to those of the isolation structures 304c illustrated in FIGS. 3C-3F.

Figure 4I:
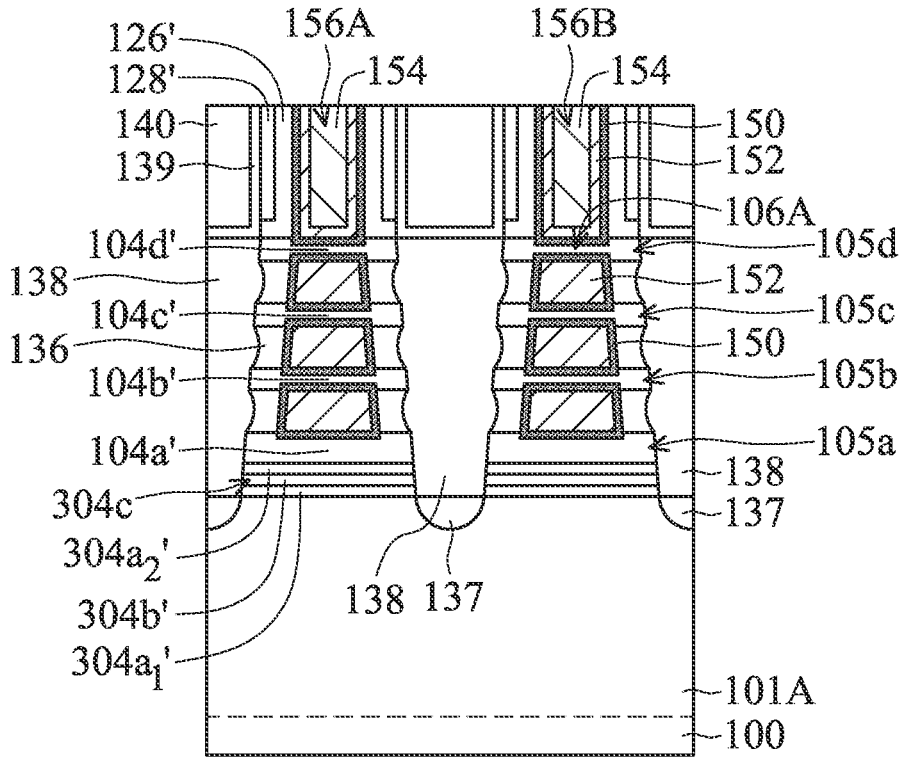

Afterwards, processes the same as or similar to those illustrated in FIGS. 3L-3P are performed, in accordance with some embodiments. As a result, similar to FIG. 3P, the structure shown in FIG. 4I is formed. The isolation structures 304c may help to reduce or prevent leakage current and to enhance heat dissipation of the semiconductor device structure. The performance and reliability of the semiconductor device structure is significantly improved.

In some embodiments, the isolation structures 304c are formed using the method illustrated in FIGS. 3C-3F. However, embodiments of the disclosure are not limited thereto. Many variations and/or modifications can be made to embodiments of the disclosure.

Figure 5A:
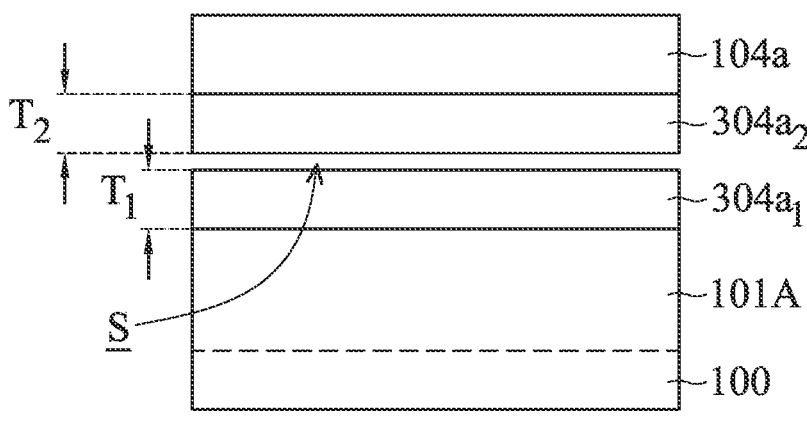
FIGS. 5A-5C are cross-sectional views of various stages of a process for forming a portion of a semiconductor device structure, in accordance with some embodiments.
Figure 5B:
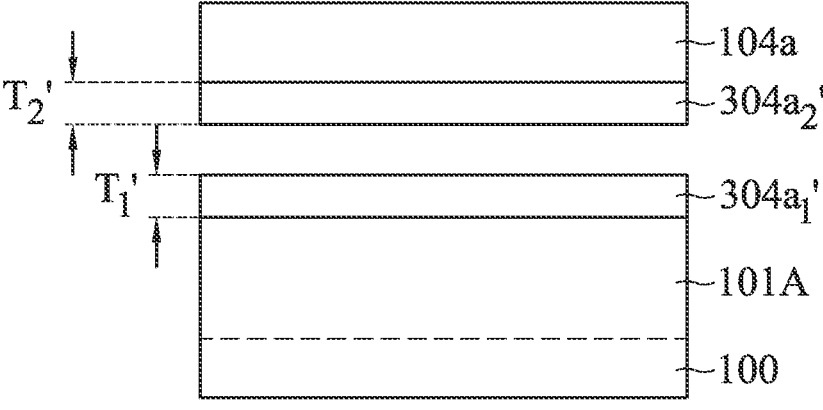
Figure 5C:
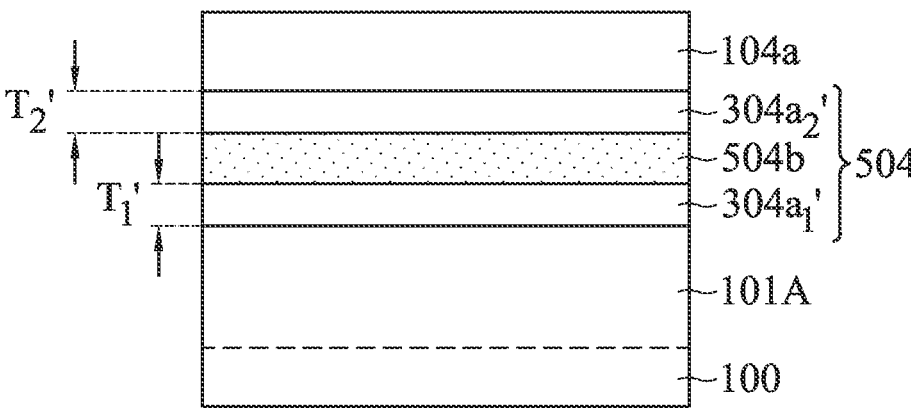

FIGS. 5A-5C are cross-sectional views of various stages of a process for forming a portion of a semiconductor device structure, in accordance with some embodiments. In some embodiments, FIGS. 5A-5C show various stages of a process for forming the isolation structures. Instead of the process illustrated in FIGS. 3C-3F or 4H, the method illustrated in FIGS. 5A-5C may be used to form the isolation structures.

As shown in FIG. 5A, a structure similar to that shown in FIG. 3C is formed. In some embodiments, FIG. 5A is an enlarged cross-sectional view showing a portion of the semiconductor device structure near the region where the isolation structure is to be formed. In some embodiments, like the embodiments shown in FIG. 3C, first dielectric layer 304a₁ and second dielectric layer 304a₂ are respectively formed on the top, upper surface of the semiconductor fin 101A and the bottom, lower surface of the semiconductor layer 104a, as shown in FIG. 5A.

The material and formation method of the first dielectric layer 304a₁ and the second dielectric layer 304a₂ may be the same as or similar to those of the first dielectric layer 304a₁ and the second dielectric layer 304a₂ illustrated in FIG. 3C. In some embodiments, like the embodiments shown in FIG. 3C, a seam S is naturally formed between the first dielectric layer 304a₁ and the second dielectric layer 304a₂. As shown in FIG. 5A, the first dielectric layer 304a₁ has a thickness of $T_1$, and the second dielectric layer 304a₂ has a thickness of $T_2$. In some embodiments, the thickness $T_1$ is substantially equal to the thickness $T_2$.

As shown in FIG. 5B, the first dielectric layer 304a₁ and the second dielectric layer 304a₂ are then crystallized to form the first dielectric layer 304a₁' and the second dielectric layer 304a₂', in accordance with some embodiments. After the crystallization, the thermal conductivity of the first dielectric layer 304a₁' and the second dielectric layer 304a₂' may be further improved. In some embodiments, one or more annealing processes are used to turn the first dielectric layer 304a₁ and the second dielectric layer 304a₂ that are amorphous into the first dielectric layer 304a₁' and the second dielectric layer 304a₂' that are crystallized.

In some embodiments, after the crystallization, the first dielectric layer 304a₁' and the second dielectric layer 304a₂' shrink. As a result, the gap between the first dielectric layer 304a₁' and the second dielectric layer 304a₂' is enlarged, which facilitates a subsequent formation of an intermediate dielectric layer. As shown in FIG. 5B, after the crystallization, the first dielectric layer 304a₁' has a thickness of $T_1'$, and the second dielectric layer 304a₂' has a thickness of $T_2'$. In some embodiments, the thickness $T_1'$ is smaller than the thickness $T_1$, and the thickness $T_2'$ is smaller than the thickness $T_2$. In some embodiments, the thickness $T_1'$ is substantially equal to the thickness $T_2'$.

As shown in FIG. 5C, an intermediate dielectric layer 504b is formed to fill the gap between the first dielectric layer 304a₁' and the second dielectric layer 304a₂' that have been crystallized, in accordance with some embodiments. The intermediate dielectric layer 504b may be made of an oxide material such as silicon oxide. The intermediate dielectric layer 504b may be formed using an FCVD process, an ALD process, one or more other applicable processes, or a combination thereof. In some embodiments, the intermediate dielectric layer 504b is not crystallized. In some other embodiments, the intermediate dielectric layer 504b is crystallized.

The first dielectric layer 304a₁', the intermediate dielectric layer 504b, and the second dielectric layer 304a₂' together form an isolation structure 504. The isolation structure 504 may help to enhance heat dissipation of the semiconductor device structure and to reduce leakage current. The performance and reliability of the semiconductor device structure are improved.

FIGS. 6A-6D are cross-sectional views of various stages of a process for forming a portion of a semiconductor device structure, in accordance with some embodiments. In some embodiments, FIGS. 6A-6D show various stages of a process for forming the isolation structures. Instead of the process illustrated in FIGS. 3C-3F or 4H, the method illustrated in FIGS. 6A-6D may be used to form the isolation structures.

Figure 6A:
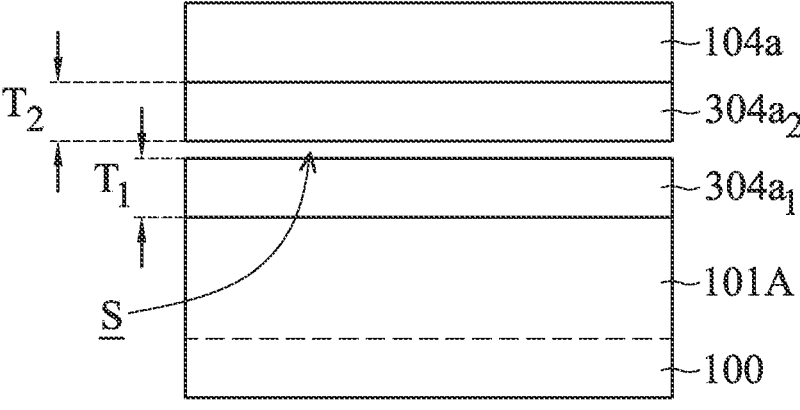
FIGS. 6A-6D are cross-sectional views of various stages of a process for forming a portion of a semiconductor device structure, in accordance with some embodiments.
Figure 6B:
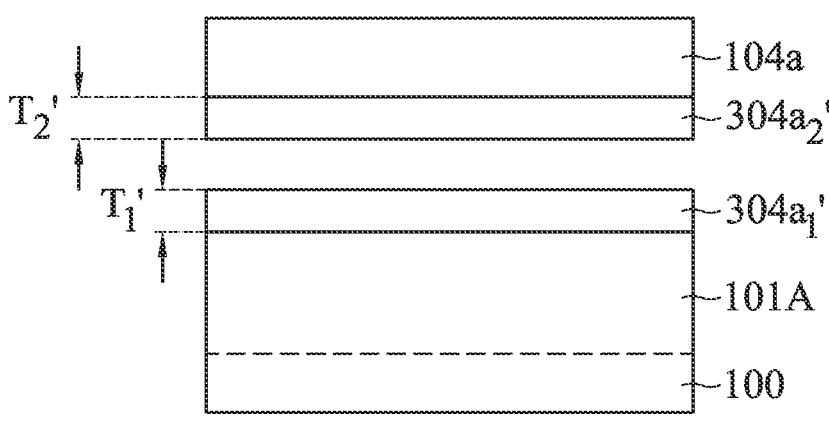

As shown in FIG. 6A, a structure that is the same as or similar to that shown in FIG. 5A is formed, in accordance with some embodiments. Afterwards, like the embodiments illustrated in FIG. 5B, the first dielectric layer 304a₁ and the second dielectric layer 304a₂ are then crystallized to form the first dielectric layer 304a₁' and the second dielectric layer 304a₂', as shown in FIG. 6B in accordance with some embodiments. In some embodiments, due to the crystallization, the first dielectric layer 304a₁' and the second dielectric layer 304a₂' shrink. As a result, the gap between the first dielectric layer 304a₁' and the second dielectric layer 304a₂' is enlarged, which facilitates a subsequent formation of an intermediate dielectric layer.

Figure 6C:
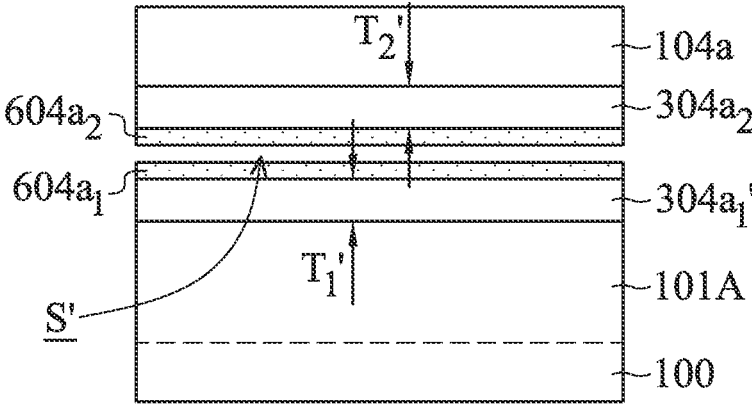

As shown in FIG. 6C, a third dielectric layer $604a_1$ and a fourth dielectric layer $604a_2$ are respectively formed over the top surface of the first dielectric layer $304a_1'$ and the bottom surface of the second dielectric layer $304a_2'$, in accordance with some embodiments. In some embodiments, the third dielectric layer $604a_1$ is in direct contact with the first dielectric layer $304a_1'$, and the fourth dielectric layer $604a_2$ is in direct contact with the second dielectric layer $304a_2'$. In some embodiments, a seam S' is naturally formed between the third dielectric layer $604a_1$ and the fourth dielectric layer $604a_2$.

In some embodiments, the third dielectric layer $604a_1$ and the fourth dielectric layer $604a_2$ are made of a dielectric material that will expand after being annealed. For example, the third dielectric layer $604a_1$ and the fourth dielectric layer $604a_2$ are made of or include a nitrogen-containing oxide material, such as carbon-containing silicon oxynitride (SiOCN). In some embodiments, the third dielectric layer $604a_1$ and the fourth dielectric layer $604a_2$ may be made of silicon oxycarbonitride having an amorphous structure, which may be referred to as amorphous crystalline (a-SiOCN), or other nitrogen-containing dielectric material having an amorphous structure. The third dielectric layer $604a_1$ and the fourth dielectric layer $604a_2$ may be formed using an ALD process, one or more other applicable processes, or a combination thereof.

Figure 6D:
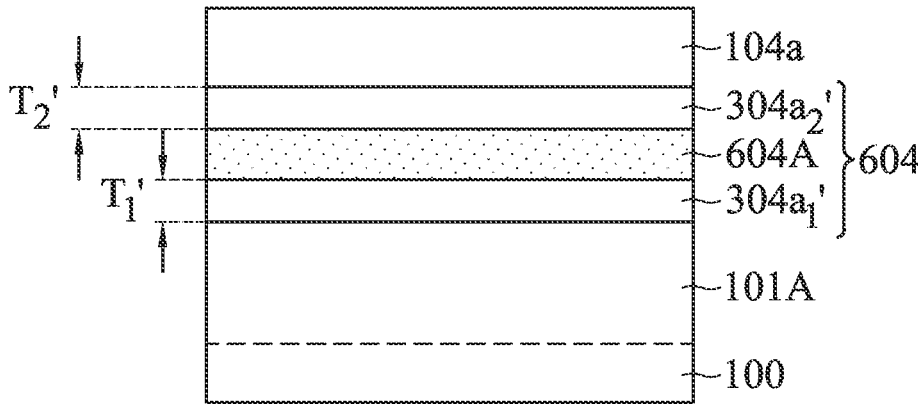

As shown in FIG. 6D, the third dielectric layer $604a_1$ and the fourth dielectric layer $604a_2$ are annealed, in accordance with some embodiments. As a result, the third dielectric layer $604a_1$ and the fourth dielectric layer $604a_2$ expand and merge together to form an intermediate dielectric layer 604A, as shown in FIG. 6D. In some embodiments, the intermediate dielectric layer 604A substantially fills the seam S'. The first dielectric layer $304a_1'$, the intermediate dielectric layer 604A, and the second dielectric layer $304a_2'$ together form an isolation structure 604. In some embodiments, intermediate dielectric layer 604A may be made of silicon oxycarbonitride having a crystalline structure, which may be referred to as crystalline silicon oxycarbonitride (c-SiOCN), or other nitrogen-containing dielectric material having a crystalline structure. The isolation structure 604 may help to enhance heat dissipation of the semiconductor device structure and to reduce leakage current. The performance and reliability of the semiconductor device structure are improved.

In some embodiments illustrated in FIGS. 3D-3E, the seam elimination operation 306 introduces particles 303 into the seam S such that the entirety of the seam S is completely filled with the intermediate dielectric layer 304b. However, embodiments of the disclosure are not limited thereto. Many variations and/or modifications can be made to embodiments of the disclosure. In some other embodiments, the seam is partially filled with the intermediate dielectric layer.

Figure 7A:
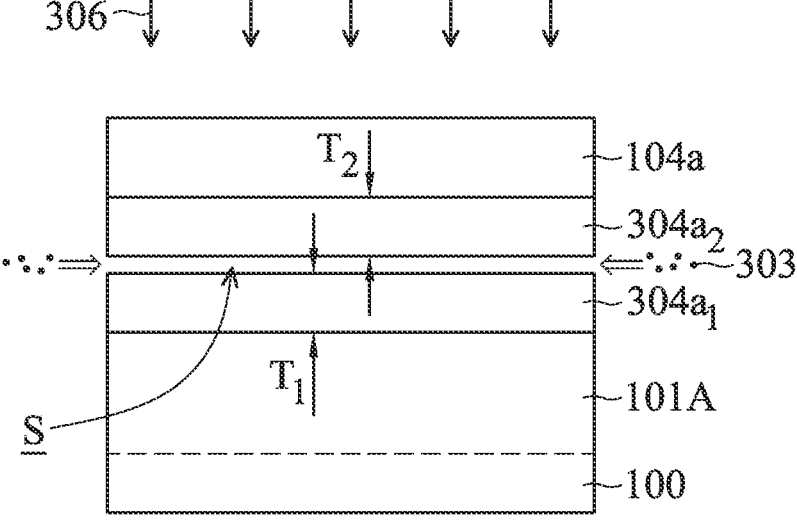
FIGS. 7A-7C are cross-sectional views of various stages of a process for forming a portion of a semiconductor device structure, in accordance with some embodiments.
Figure 7B:
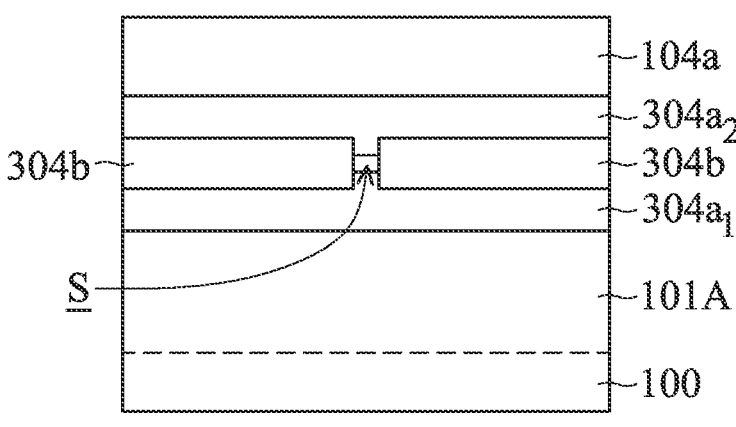
Figure 7C:
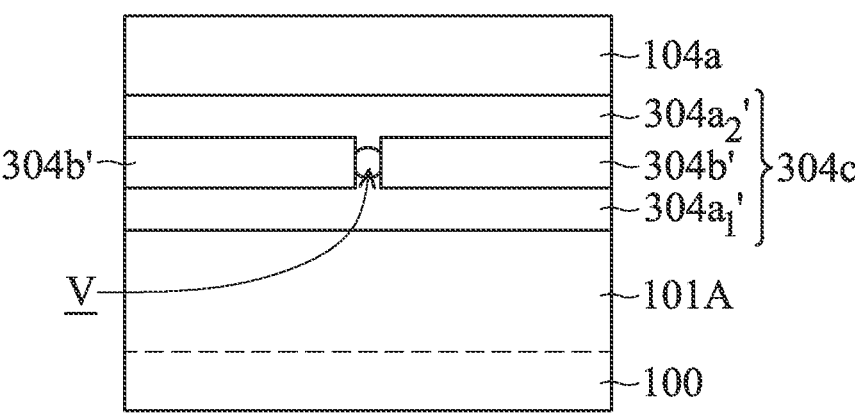

FIGS. 7A-7C are cross-sectional views of various stages of a process for forming a portion of a semiconductor device structure, in accordance with some embodiments. As shown in FIG. 7A, like the embodiments illustrated in FIG. 3D, the seam elimination operation 306 introduces particles 303 into the seam S.

As shown in FIG. 7B, like the embodiments illustrated in FIG. 3E, portions of the first dielectric layer $304a_1$ and portions of the second dielectric layer $304a_2$ are turned into the intermediate dielectric layer 304b, but because the particles 303 cannot reach an interior portion and/or a center portion of seam S, the intermediate dielectric layer 304b partially fills the seam S.

In some embodiments, the distance between an edge of the seam S and an inner portion of the seam S is long. In some cases, the introduced particles 303 may not be able to reach the inner portion of the seam S. The portions of the first dielectric layer $304a_1$ and the second dielectric layer $304a_2$ are thus not turned into the intermediate dielectric layer 304b in the inner portion. As a result, the inner portion of the seam S remains not being filled with the intermediate dielectric layer 304b. As shown in FIG. 7B, the remaining portion of the seam S is surrounded by the first dielectric layer $304a_1$, the second dielectric layer $304a_2$, and the intermediate dielectric layer 304b.

As shown in FIG. 7C, like the embodiments illustrated in FIG. 3F, one or more annealing processes are used to crystallize the multiple dielectric layers, in accordance with some embodiments. As a result, the first dielectric layer $304a_1'$, the second dielectric layer $304a_2'$, and the intermediate dielectric layer 304b' that are crystallized are formed. The first dielectric layer $304a_1'$, the second dielectric layer $304a_2'$, and the intermediate dielectric layer 304b' together form the isolation structure 304c. The isolation structure 304c may help to enhance heat dissipation of the semiconductor device structure and to reduce leakage current. The performance and reliability of the semiconductor device structure are improved.

In some embodiments, some of the first dielectric layer $304a_1'$, the second dielectric layer $304a_2'$, and the intermediate dielectric layer 304b' shrink due to the crystallization. The profile of the remaining portion of the seam S may thus be changed. In some embodiments, a void V is thus formed inside the isolation structure 304c, as shown in FIG. 7C.

In some embodiments illustrated in FIGS. 3D-3E, the seam elimination operation 306 forms the intermediate dielectric layer 304b with a substantially uniform thickness. However, embodiments of the disclosure are not limited thereto. Many variations and/or modifications can be made to embodiments of the disclosure. In some other embodiments, different portions of the intermediate dielectric layer 304b have different thicknesses.

Figure 8A:
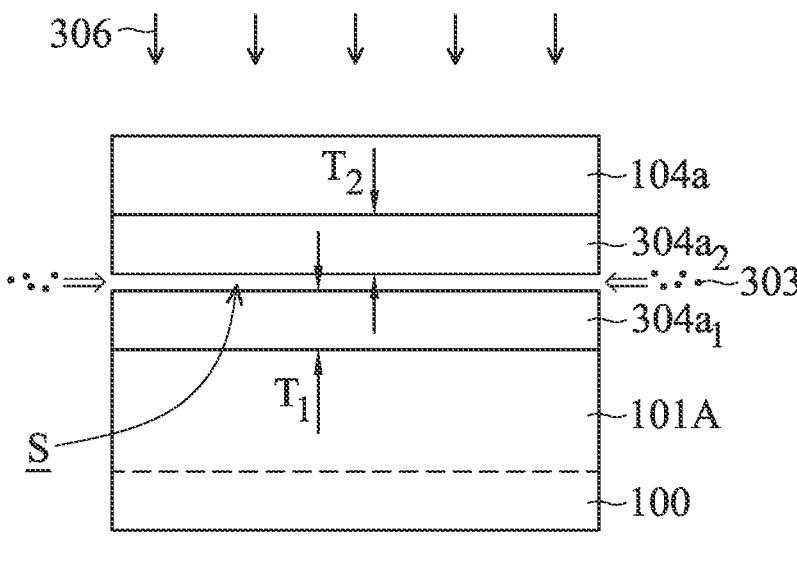
FIGS. 8A-8C are cross-sectional views of various stages of a process for forming a portion of a semiconductor device structure, in accordance with some embodiments.
Figure 8B:
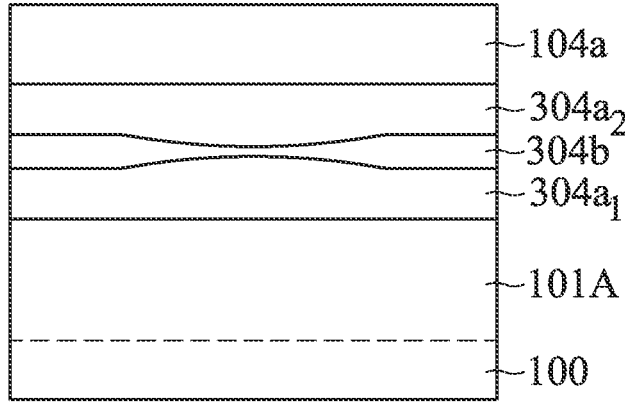
Figure 8C:
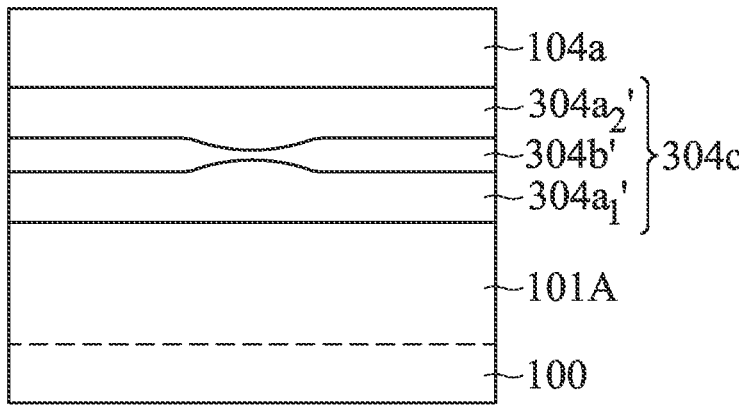

FIGS. 8A-8C are cross-sectional views of various stages of a process for forming a portion of a semiconductor device structure, in accordance with some embodiments. As shown in FIG. 8A, like the embodiments illustrated in FIG. 7A, the seam elimination operation 306 introduces particles 303 into the seam S.

As shown in FIG. 8B, like the embodiments illustrated in FIG. 7B, the portions of the first dielectric layer $304a_1$ and the second dielectric layer $304a_2$ near the seam S are turned into the intermediate dielectric layer 304b due to the introducing of the particles 303. In some embodiments, the intermediate dielectric layer 304b completely fills the seam S, as shown in FIG. 8B.

In some embodiments, the amount of particles 303 reaching the outer portions of the seam S is greater than the amount of particles 303 reaching the inner portion of the seam S. As a result, the outer portions of the intermediate dielectric layer 304b are thicker than the inner portion of the intermediate dielectric layer 304b. In some embodiments, the intermediate dielectric layer 304b gradually becomes thicker along the direction from the inner portion towards the outer portion of the intermediate dielectric layer 304b. In some embodiments, the amount of particles 303 reaching the outermost portions of the seam S is substantially equal to the amount of particles 303 reaching the outer portions of the seam S. In these cases, the outermost portions of intermediate dielectric layer 304*b* is substantially as thick as the outer portions of the intermediate dielectric layer 304*b*, as shown in FIG. 8B.

As shown in FIG. 8C, like the embodiments illustrated in FIG. 7C, one or more annealing processes are used to crystallize the multiple dielectric layers, in accordance with some embodiments. As a result, the first dielectric layer 304*a*$_1$', the second dielectric layer 304*a*$_2$', and the intermediate dielectric layer 304*b*' that are crystallized are formed. The first dielectric layer 304*a*$_1$, the second dielectric layer 304*a*$_2$', and the intermediate dielectric layer 304*b*' together form the isolation structure 304*c*. The isolation structure 304*c* may help to enhance heat dissipation of the semiconductor device structure and to reduce leakage current. The performance and reliability of the semiconductor device structure are improved.

Embodiments of the disclosure form a semiconductor device structure with an isolation structure under a channel structure. The isolation structure includes two metal-containing dielectric layers and an intermediate dielectric layer between the metal-containing dielectric layers. The isolation structure helps to enhance heat dissipation of the semiconductor device structure and to reduce or prevent leakage current. The performance and reliability of the semiconductor device structure are greatly improved.

In accordance with some embodiments, a semiconductor device structure is provided. The semiconductor device structure includes multiple channel structures over a substrate and a gate stack wrapped around the channel structures. The semiconductor device structure also includes an isolation structure between the gate stack and the substrate. The isolation structure has a first metal-containing dielectric layer and a second metal-containing dielectric layer. The isolation structure has an intermediate dielectric layer between the first metal-containing dielectric layer and the second metal-containing dielectric layer.

In accordance with some embodiments, a method for forming a semiconductor device structure is provided. The method includes forming a fin structure over a substrate, and the fin structure has a sacrificial base layer. The fin structure has multiple sacrificial layers and multiple semiconductor layers laid out alternately over the sacrificial base layer. The method also includes forming a gate stack to wrap around a portion of the fin structure and removing the sacrificial base layer to form a recess between the substrate and the fin structure. The method further includes respectively forming a first dielectric layer and a second dielectric layer over an upper sidewall and a lower sidewall of the recess. In addition, the method includes forming an intermediate dielectric layer between the first dielectric layer and the second dielectric layer.

In accordance with some embodiments, a method for forming a semiconductor device structure is provided. The method includes forming a sacrificial base layer over a substrate and forming a semiconductor stack over the sacrificial base layer. The semiconductor stack has multiple sacrificial layers and multiple semiconductor layers laid out alternately. The method also includes forming a gate stack to partially cover the sacrificial base layer, the semiconductor layers, and the sacrificial layers. The method further includes removing the sacrificial base layer to form a recess between the substrate and the semiconductor stack. In addition, the method includes forming a metal-containing dielectric structure to partially or completely fill the recess. The metal-containing dielectric structure has multiple sub-layers.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
    forming a fin structure over a substrate, wherein the fin structure has a substrate portion, a sacrificial base layer over the substrate portion, and a plurality of sacrificial layers and a plurality of semiconductor layers over the sacrificial base layer, wherein the plurality of sacrificial layers and the plurality of semiconductor layers have an alternating configuration;
    forming a gate stack that wraps a portion of the fin structure;
    removing the sacrificial base layer to form a recess between the substrate portion and a bottom one of the plurality of semiconductor layers;
    forming a first dielectric layer over the substrate portion exposed by the recess and a second dielectric layer over the bottom one of the plurality of semiconductor layers exposed by the recess; and
    forming an intermediate dielectric layer between the first dielectric layer and the second dielectric layer, wherein the forming the intermediate dielectric layer includes introducing nitrogen-containing plasma into a seam between the first dielectric layer and the second dielectric layer, such that a portion of the first dielectric layer and a portion of the second dielectric layer turn into the intermediate dielectric layer.

2. The method of claim 1, wherein the forming the first dielectric layer includes depositing a first aluminum oxide layer, the forming the second dielectric layer includes depositing a second aluminum oxide layer, and the forming the intermediate dielectric layer includes forming an aluminum nitride layer, wherein the introducing nitrogen-containing plasma into the seam between the first dielectric layer and the second dielectric layer turns the portion of the first dielectric layer and the portion of the second dielectric layer into aluminum nitride.

3. The method of claim 1, further comprising crystallizing the first dielectric layer, the intermediate dielectric layer, and the second dielectric layer.

4. The method of claim 1, wherein the portion of the fin structure wrapped by the gate stack is a first portion of the fin structure, the recess is a first recess, and the method further comprises:
    removing a second portion of the fin structure to form a second recess; and
    forming an epitaxial structure in the second recess after forming the first dielectric layer, the second dielectric layer, and the intermediate dielectric layer.

5. The method of claim 4, wherein the second recess is formed after forming the first dielectric layer, the second dielectric layer, and the intermediate dielectric layer.

6. The method of claim 4, wherein the second recess is formed before forming the first dielectric layer, the second dielectric layer, and the intermediate dielectric layer.

7. The method of claim 1, further comprising crystallizing the first dielectric layer and the second dielectric layer before forming the intermediate dielectric layer.

8. The method of claim 1, further comprising:

annealing the first dielectric layer and the second dielectric layer before forming the intermediate dielectric layer;

after the annealing of the first dielectric layer and the second dielectric layer, forming a third dielectric layer over the first dielectric layer and a fourth dielectric layer over the second dielectric layer; and annealing the third dielectric layer and the fourth dielectric layer, such that the third dielectric layer and the fourth dielectric layer expand and merge to form the intermediate dielectric layer.

9. The method of claim 1, wherein the gate stack is a dummy gate stack and the method further comprises:

removing the dummy gate stack; and after removing the plurality of sacrificial layers, forming a metal gate stack that surrounds at least one of the plurality of semiconductor layers.

10. The method of claim 1, wherein the first dielectric layer and the second dielectric layer are simultaneously formed by an atomic layer deposition process.

11. A method comprising:

forming a sacrificial base layer over a substrate;

forming a semiconductor stack over the sacrificial base layer, wherein the semiconductor stack has a first semiconductor layer over the sacrificial base layer, a sacrificial layer over the first semiconductor layer, and a second semiconductor layer over the sacrificial layer;

before forming an epitaxial source/drain structure, removing the sacrificial base layer to form a gap between the substrate and the first semiconductor layer; and forming a metal-containing, multilayer dielectric structure in the gap, wherein the forming the metal-containing, multilayer dielectric structure includes performing a deposition process to form a metal-containing dielectric material in the gap and a nitridation treatment process that causes expansion of the metal-containing dielectric material.

12. The method of claim 11, wherein the deposition process to form the metal-containing dielectric material includes performing an atomic layer deposition process to form a first metal-containing dielectric layer partially filling the gap and over the substrate and a second metal-containing dielectric layer partially filling the gap and over the first semiconductor layer, wherein a seam is between the first metal-containing dielectric layer and the second metal-containing dielectric layer and wherein the nitridation treatment process causes expansion of the first metal-containing dielectric layer and the second metal-containing dielectric layer to eliminate the seam.

13. The method of claim 12, wherein the nitridation treatment process converts a portion of the first metal-containing dielectric layer and a portion of the second metal-containing dielectric layer into a nitrogen-containing dielectric layer, wherein the nitrogen-containing dielectric layer is between a remaining portion of the first metal-containing dielectric layer and a remaining portion of the second metal-containing dielectric layer and the nitrogen-containing dielectric layer fills the seam.

14. The method of claim 13, wherein the forming the metal-containing, multilayer dielectric structure further includes crystallizing the first metal-containing dielectric layer, the second metal-containing dielectric layer, and the nitrogen-containing dielectric layer.

15. The method of claim 12, wherein the forming the metal-containing, multilayer dielectric structure further includes:

annealing the first metal-containing dielectric layer and the second metal-containing dielectric layer to enlarge the seam before performing the nitridation treatment process; and forming an intermediate dielectric layer in the enlarged seam.

16. A method comprising:

forming a plurality of channel structures over a substrate;

forming a gate stack that wraps around the plurality of channel structures; and forming an isolation structure between a bottom one of the plurality of channel structures and the substrate, wherein the forming the isolation structure includes:

forming a first metal-containing dielectric layer, forming a second metal-containing dielectric layer, forming an intermediate dielectric layer between the first metal-containing dielectric layer and the second metal-containing dielectric layer, wherein each of the as-formed first metal-containing dielectric layer, the as-formed second metal-containing dielectric layer, and the as-formed intermediate dielectric layer has an amorphous structure, and performing an annealing process to convert the amorphous structure of each of the as-formed first metal-containing dielectric layer, the as-formed second metal-containing dielectric layer, and the as-formed intermediate dielectric layer into a crystalline structure.

17. The method of claim 16, wherein:

the forming the first metal-containing dielectric layer and the second metal-containing dielectric layer includes forming a first aluminum-and-oxygen containing dielectric layer and a second aluminum-and-oxygen containing dielectric layer, respectively; and the forming the intermediate dielectric layer includes forming an aluminum-and-nitrogen containing dielectric layer between the first aluminum-and-oxygen containing dielectric layer and the second aluminum-and-oxygen containing dielectric layer.

18. The method of claim 16, further comprising forming a first source/drain structure and a second source/drain structure after forming the isolation structure.

19. The method of claim 18, further comprising forming the gate stack after forming the first source/drain structure and the second source/drain structure.

20. The method of claim 16, wherein:

the forming the first metal-containing dielectric layer and the second metal-containing dielectric layer includes:

removing a sacrificial base layer to form a gap over the substrate, and depositing the first metal-containing dielectric layer and the second metal-containing dielectric layer, wherein the first metal-containing dielectric layer and the second metal-containing dielectric layer partially fill the gap and a seam is between the first metal-containing dielectric layer and the second metal-containing dielectric layer; and the forming the intermediate dielectric layer includes performing a nitridation process to form the intermediate dielectric layer in the seam.

* * * * *